(12) United States Patent
Kim et al.

(10) Patent No.: US 10,332,947 B2
(45) Date of Patent: Jun. 25, 2019

(54) DISPLAY DEVICE AND METHOD OF MANUFACTURING SAME

(71) Applicant: Samsung Display Co., Ltd., Yongin-si, Gyeonggi-do (KR)

(72) Inventors: Woongsik Kim, Yongin-si (KR); Minwoo Kim, Yongin-si (KR); Wonsang Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/690,131

(22) Filed: Aug. 29, 2017

(65) Prior Publication Data

US 2018/0069063 A1    Mar. 8, 2018

(30) Foreign Application Priority Data

Sep. 2, 2016   (KR) .................. 10-2016-0113260

(51) Int. Cl.
| | |
|---|---|
| *H01L 27/32* | (2006.01) |
| *G02F 1/1333* | (2006.01) |
| *G02F 1/1343* | (2006.01) |
| *G02F 1/1362* | (2006.01) |
| *H01L 51/52* | (2006.01) |
| *H01L 51/56* | (2006.01) |

(52) U.S. Cl.
CPC ........ *H01L 27/3248* (2013.01); *G02F 1/1343* (2013.01); *G02F 1/133345* (2013.01); *G02F 1/136213* (2013.01); *H01L 27/326* (2013.01); *H01L 51/5253* (2013.01); *H01L 51/56* (2013.01); *H01L 27/3244* (2013.01)

(58) Field of Classification Search
CPC ............ G02F 1/136213; G02F 1/1343; G02F 1/133345; H01L 27/3248
See application file for complete search history.

(56) References Cited

U.S. PATENT DOCUMENTS

| 7,202,597 B2 | 4/2007 | Sakurai |
|---|---|---|
| 7,641,530 B2 | 1/2010 | Yuki et al. |
| | (Continued) | |

FOREIGN PATENT DOCUMENTS

| EP | 1 612 871 A2 | 1/2006 |
|---|---|---|
| KR | 10-2005-0020936 A | 3/2005 |
| | (Continued) | |

*Primary Examiner* — Kevin Quarterman
(74) *Attorney, Agent, or Firm* — Lewis Roca Rothgerber Christie LLP

(57) ABSTRACT

A display device comprises a circuit element layer on a substrate and comprising a thin film transistor, a storage capacitor, and a pixel electrode connected thereto, a display layer comprising an emission layer, an opposite electrode on the emission layer, and a functional layer, a thin encapsulation layer on the display layer, the thin encapsulation layer comprising at least one inorganic layer and at least one organic layer, and a through portion passing through the substrate, the circuit element layer, the display layer, and the thin encapsulation layer, wherein a slope angle of a lateral surface of the display layer adjacent to the through portion is different from that of one of a lateral surface of the substrate, a lateral surface of the circuit element layer, and a lateral surface of the thin encapsulation layer that are adjacent to the through portion.

9 Claims, 14 Drawing Sheets

(56) References Cited

U.S. PATENT DOCUMENTS

| | | |
|---|---|---|
| 2014/0225131 A1 | 8/2014 | Benson et al. |
| 2016/0147109 A1* | 5/2016 | Yamazaki ......... G02F 1/133345 349/42 |
| 2016/0363909 A1 | 12/2016 | Kang et al. |
| 2017/0025070 A1 | 1/2017 | Kang et al. |
| 2017/0033287 A1* | 2/2017 | Chida ................... H01L 51/003 |
| 2017/0047544 A1 | 2/2017 | Kang et al. |
| 2017/0077209 A1 | 3/2017 | Kim et al. |
| 2017/0077447 A1 | 3/2017 | Kang et al. |
| 2017/0094817 A1 | 3/2017 | Kang et al. |
| 2017/0101013 A1 | 4/2017 | Jeong et al. |
| 2017/0110532 A1 | 4/2017 | Kim et al. |
| 2017/0127546 A1 | 5/2017 | Kim et al. |
| 2017/0148856 A1 | 5/2017 | Choi et al. |
| 2017/0149014 A1 | 5/2017 | Choi et al. |
| 2017/0150618 A1 | 5/2017 | Choi et al. |
| 2017/0162111 A1 | 6/2017 | Kang et al. |
| 2017/0162637 A1* | 6/2017 | Choi ........................ G09G 3/20 |
| 2017/0193634 A1 | 7/2017 | Kim et al. |
| 2017/0237037 A1 | 8/2017 | Choi et al. |

FOREIGN PATENT DOCUMENTS

| | | |
|---|---|---|
| KR | 10-2016-0147116 A | 12/2016 |
| KR | 10-2017-0012683 A | 2/2017 |
| KR | 10-2017-0019553 A | 2/2017 |
| KR | 10-2017-0031849 A | 3/2017 |
| KR | 10-2017-0032955 A | 3/2017 |
| KR | 10-2017-0038993 A | 4/2017 |
| KR | 10-2017-0043725 A | 4/2017 |
| KR | 10-2017-0045459 A | 4/2017 |
| KR | 10-2017-0051840 A | 5/2017 |
| KR | 10-2017-0059527 A | 5/2017 |
| KR | 10-2017-0059537 A | 5/2017 |
| KR | 10-2017-0059864 | 5/2017 |
| KR | 10-2017-0065059 A | 6/2017 |
| KR | 10-2017-0066767 A | 6/2017 |
| KR | 10-2017-0080797 A | 7/2017 |
| KR | 10-2017-0090019 A | 8/2017 |
| KR | 10-2017-0095444 | 8/2017 |

\* cited by examiner

DISPLAY DEVICE AND METHOD OF MANUFACTURING SAME

CROSS-REFERENCE TO RELATED APPLICATION

This application claims priority to and the benefit of Korean Patent Application No. 10-2016-0113260, filed on Sep. 2, 2016, in the Korean Intellectual Property Office, the disclosure of which is incorporated herein in its entirety by reference.

BACKGROUND

1. Field

Aspects of one or more embodiments relate to a light-emitting device and a method of controlling the same.

2. Description of the Related Art

Recently, the purposes of display devices have become diversified. Display devices have also become thinner and more lightweight, and thus, their range of usage has gradually widened. In particular, display devices have been used recently in various apparatuses such as monitors, mobile phones, and clocks, and thus various methods of designing the display devices have been studied.

SUMMARY

Aspects of one or more embodiments are directed to a display device having a through portion and a method of manufacturing the same. The above embodiments are merely provided as an example, and the scope of the inventive concept is not limited thereto.

Additional aspects will be set forth in part in the description which follows and, in part, will be apparent from the description, or may be learned by practice of the presented embodiments.

According to one or more embodiments, there is provided a display device comprising: a substrate; a circuit element layer on the substrate and comprising a thin film transistor, a storage capacitor, and a pixel electrode electrically connected to the thin film transistor and the storage capacitor; a display layer on the circuit element layer, the display layer including an emission layer, an opposite electrode on the emission layer, and a functional layer arranged in at least one of a space between the emission layer and the opposite electrode and a space between the emission layer and the pixel electrode; a thin encapsulation layer on the display layer, the thin encapsulation layer including at least one inorganic layer and at least one organic layer; and a through portion passing through the substrate, the circuit element layer, the display layer, and the thin encapsulation layer, wherein a slope angle of a lateral surface of the display layer adjacent to the through portion is different from a slope angle of one of a lateral surface of the substrate, a lateral surface of the circuit element layer, and a lateral surface of the thin encapsulation layer that are adjacent to the through portion.

In some embodiments, the functional layer includes at least one of a hole injection layer, a hole transport layer, an electron injection layer, and an electron transport layer.

In some embodiments, the display layer includes at least one of a capping layer and an inorganic barrier layer, the capping layer and the inorganic barrier layer being on the opposite electrode.

In some embodiments, the display device further includes: an additional inorganic layer on the thin encapsulation layer, the additional inorganic layer covering a lateral surface of the at least one organic layer that is adjacent to the through portion and the lateral surface of the display layer.

In some embodiments, the additional inorganic layer directly contacts an inorganic insulating layer of the circuit element layer.

In some embodiments, the display device further includes: a step difference portion adjacent to the through portion and having an undercut shape.

In some embodiments, the step difference portion is between the display layer and the substrate.

In some embodiments, the step difference portion includes: a first layer and a second layer including materials different from each other.

In some embodiments, the substrate includes a resin material.

According to some embodiments of the present invention, there is provided a method of manufacturing a display device, the method including: forming a circuit element layer on a substrate and including a thin film transistor, a storage capacitor, and a pixel electrode electrically connected to the thin film transistor and the storage capacitor; forming a display layer on the circuit element layer, the display layer including an emission layer, an opposite electrode, and a functional layer arranged in at least one of a space between the emission layer and the opposite electrode and a space between the emission layer and the pixel electrode; forming a thin encapsulation layer on the display layer, the thin encapsulation layer including at least one inorganic layer and at least one organic layer; and forming a through portion passing through the substrate, the circuit element layer, the display layer, and the thin encapsulation layer, wherein the forming of the through portion is performed by using mechanical polishing which removes a portion of at least one of the thin encapsulation layer, the display layer, the circuit element layer, and the substrate.

In some embodiments, a slope angle of a lateral surface of the display layer adjacent to the through portion is different from a slope angle of one of a lateral surface of the substrate adjacent to the through portion, a lateral surface of the circuit element layer, and a lateral surface of the thin encapsulation layer.

In some embodiments, in the forming of the display layer, the functional layer includes at least one of a hole injection layer, a hole transport layer, an electron injection layer, and an electron transport layer.

In some embodiments, the forming of the display layer includes:

forming at least one of a capping layer and an inorganic barrier layer on the opposite electrode.

In some embodiments, a polishing tape and a tip are used for the mechanical polishing.

In some embodiments, the forming of the through portion includes: forming a preliminary through portion by removing a portion of the thin encapsulation layer and a portion of the display layer via the mechanical polishing; and irradiating a laser beam to a location corresponding to the preliminary through portion.

In some embodiments, the method further includes: forming an additional inorganic layer on the thin encapsulation layer in which the preliminary through portion has been formed.

In some embodiments, the forming of the circuit element layer includes: forming a step difference portion having an undercut shape, the step difference portion being adjacent to the through portion.

In some embodiments, the step difference portion includes: a first layer and a second layer including materials different from each other.

In some embodiments, the forming of the through portion includes: forming a preliminary through portion by removing a portion of the display layer via the mechanical polishing; and irradiating a laser beam to a location corresponding to the preliminary through portion.

In some embodiments, the forming of the through portion includes: forming the through portion by removing a portion of the thin encapsulation layer, the display layer, the circuit element layer, and the substrate via the mechanical polishing.

A display device and a method of manufacturing the same may reduce or minimize the damage or floating of a layer (or layers) in the neighborhood of a through portion. Also, exfoliation of a layer (or layers) forming a display device may be prevented or substantially prevented. The scope of the inventive concept is not limited by this effect.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
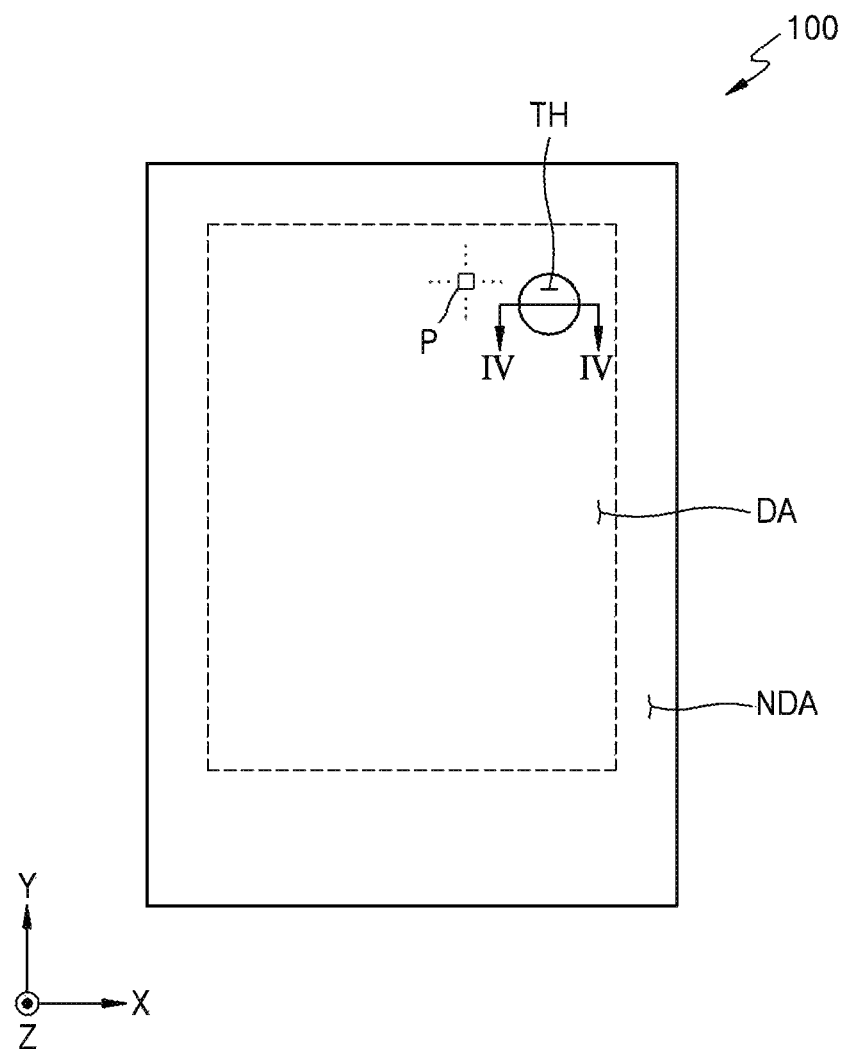
FIG. 1 is a view of an upper portion of a display device according to an example embodiment.

As the inventive concept allows for various suitable changes and numerous embodiments, exemplary embodiments will be illustrated in the drawings and described in detail in the written description. An effect and a characteristic of the inventive concept, and a method of accomplishing these will be apparent when referring to embodiments described with reference to the drawings. This inventive concept may, however, be embodied in many different forms and should not be construed as limited to the exemplary embodiments set forth herein.

Hereinafter, the inventive concept will be described more fully with reference to the accompanying drawings, in which exemplary embodiments of the inventive concept are shown. When description is made with reference to the drawings, like reference numerals in the drawings denote like or corresponding elements, and repeated description thereof may not be provided.

Sizes of elements in the drawings may be exaggerated for convenience of explanation. In other words, because sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

Figure 2A:
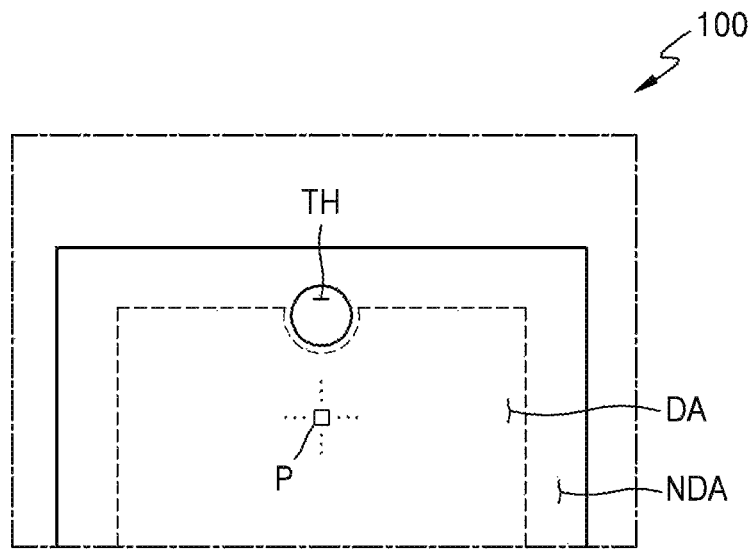
FIGS. 2A-2B are views of an upper portion of a display device according to another example embodiment.
Figure 2B:
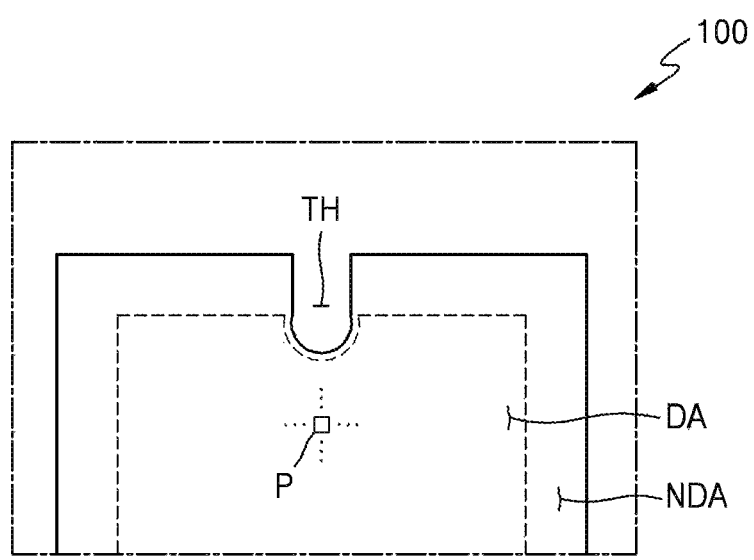

FIG. 1 is a view of an upper portion of a display device 100 according to an embodiment. FIGS. 2A and 2B are views of an upper portion of the display device 100 according to another embodiment.

Referring to FIG. 1, the display device 100 includes a display area DA and a non-display area NDA. Pixels P including a display element such as an organic light-emitting diode (OLED) are arranged in the display area DA and provide a predetermined image. The non-display area NDA is an area which does not provide an image and includes wirings and drivers (e.g. a scan driver and a data driver) transferring an electric signal and power to apply to the pixels P in the display area DA.

A through portion TH is a hole (an opening) passing through the display device 100. The through portion TH may be in the display area DA and may be surrounded by a plurality of pixels P. A camera, a sensor, a speaker, a microphone, and/or the like may be mounted to the through portion TH. In some examples, the through portion TH may be a space for a separate member for a function of the display device 100 or for adding a new function.

In an embodiment, as illustrated in FIG. 2A, the through portion TH may be arranged over the display area DA and the non-display area NDA. A portion of the through portion TH may be partially surrounded by the pixels P in the display area DA. As illustrated in FIGS. 1 and 2A, the through portion TH may be arranged inside the display device 100. In other embodiments, as illustrated in FIG. 2B, the through portion TH may extend up to the edge of the display device 100.

Figure 3A:
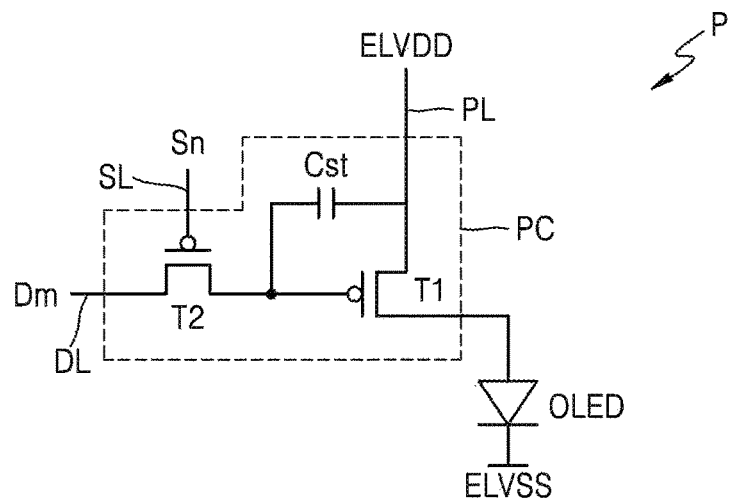
FIGS. 3A-3B are equivalent circuit diagrams of a pixel according to an example embodiment.
Figure 3B:
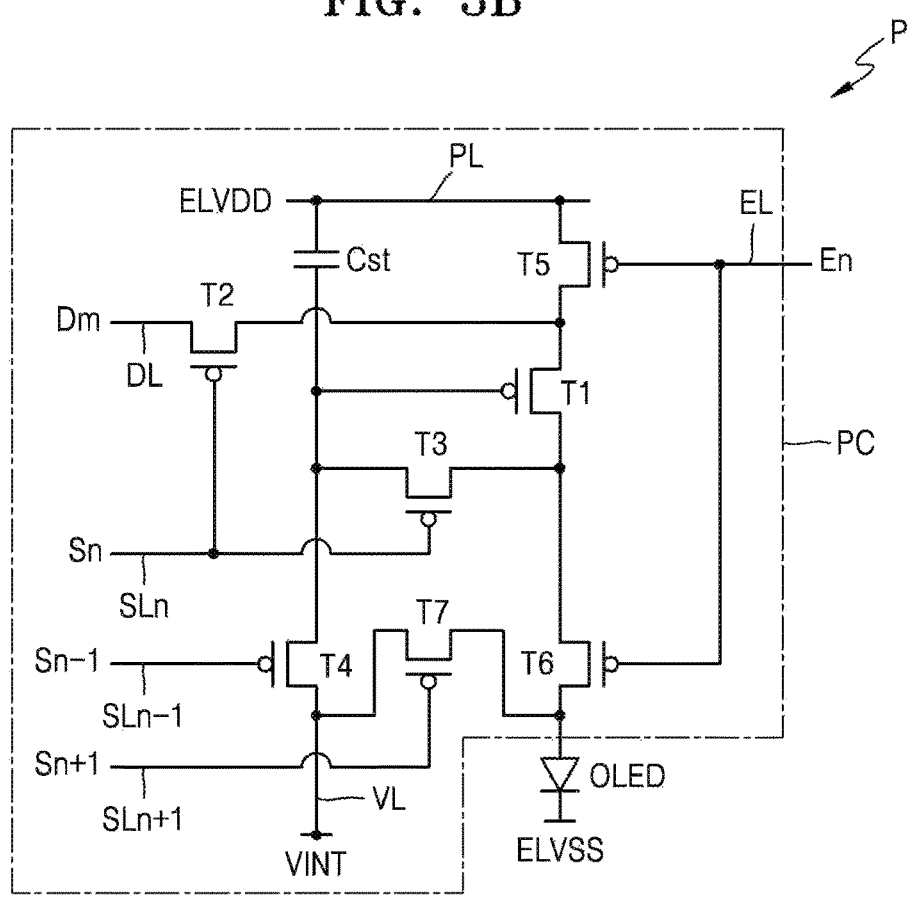

FIGS. 3A and 3B are equivalent circuit diagrams of a pixel according to an embodiment.

Referring to FIG. 3A, each pixel P includes a pixel circuit PC connected to a scan line SL and a data line DL, and an OLED connected to the pixel circuit PC.

The pixel circuit PC includes a driving thin film transistor T1, a switching thin film transistor T2, and a storage capacitor Cst. The switching thin film transistor T2 is connected to a scan line SL and a data line DL and transfers a data signal Dm input via the data line DL to the driving thin film transistor T1 in response to a scan signal Sn input via the scan line SL.

The storage capacitor Cst, connected to the switching thin film transistor T2 and a driving voltage line PL, stores a voltage corresponding to a difference between a voltage transferred from the switching thin film transistor T2 and a driving voltage ELVDD supplied to the driving voltage line PL.

The driving thin film transistor T1, connected to the driving voltage line PL and the storage capacitor Cst, may control a driving current flowing through the OLED from the driving voltage line PL in response to the voltage stored in the storage capacitor Cst. The OLED may emit light having predetermined brightness by using the driving current.

Though FIG. 3A illustrates an example in which a pixel P include two thin film transistors and one storage capacitor, the embodiment is not limited thereto.

Referring to FIG. 3B, the pixel circuit PC may include the driving and switching thin film transistors T1 and T2, a compensation thin film transistor T3, a first initialization thin film transistor T4, a first emission control thin film transistor T5, a second emission control thin film transistor T6, and a second initialization thin film transistor T7.

A drain electrode of the driving thin film transistor T1 may be electrically connected to the OLED via the second emission control thin film transistor T6. The driving thin film transistor T1 receives a data signal Dm and supplies a driving current to the OLED in response to a switching operation of the switching thin film transistor T2.

A gate electrode of the switching thin film transistor T2 is connected to a first scan line SLn, and a source electrode of the switching thin film transistor T2 is connected to the data line DL. A drain electrode of the switching thin film transistor T2 may be connected to a source electrode of the driving thin film transistor T1 and also connected to the driving voltage line PL via the first emission control thin film transistor T5.

The switching thin film transistor T2 is turned on in response to a first scan signal Sn transferred via the first scan line SLn and performs a switching operation of transferring a data signal Dm transferred via the data line DL to the source electrode of the driving thin film transistor T1.

A gate electrode of the compensation thin film transistor T3 may be connected to the first scan line SLn. A source electrode of the compensation thin film transistor T3 may be connected to the drain electrode of the driving thin film transistor T1 and also connected to a pixel electrode of the OLED via the second emission control thin film transistor T6. A drain electrode of the compensation thin film transistor T3 may be also connected to one of electrodes of the storage capacitor Cst, a source electrode of the first initialization thin film transistor T4, and the gate electrode of the driving thin film transistor T1. The compensation thin film transistor T3 is turned on in response to a first scan signal Sn transferred via the first scan line SLn and connects the gate electrode of the driving thin film transistor T1 to the drain electrode of the driving thin film transistor T1, thereby diode-connecting the driving thin film transistor T1.

A gate electrode of the first initialization thin film transistor T4 may be connected to a second scan line SLn−1. A drain electrode of the first initialization thin film transistor T4 may be connected to an initialization voltage line VL. A source electrode of the first initialization thin film transistor T4 may be connected to one of the electrodes of the storage capacitor Cst, the drain electrode of the compensation thin film transistor T3, and the gate electrode of the driving thin film transistor T1. The first initialization thin film transistor T4 is turned on in response to a second scan signal Sn−1 transferred via the second scan line SLn−1, and performs an initialization operation of initializing the voltage of the gate electrode of the driving thin film transistor T1 by transferring an initialization voltage VINT to the gate electrode of the driving thin film transistor T1.

A gate electrode of the first emission control thin film transistor T5 may be connected to an emission control line EL. A source electrode of the first emission control thin film transistor T5 may be connected to the driving voltage line PL. A drain electrode of the first emission control thin film transistor T5 is connected to the source electrode of the driving thin film transistor T1 and the drain electrode of the switching thin film transistor T2.

A gate electrode of the second emission control thin film transistor T6 may be connected to the emission control line EL. A source electrode of the second emission control thin film transistor T6 may be connected to the drain electrode of the driving thin film transistor T1 and the source electrode of the compensation thin film transistor T3. A drain electrode of the second emission control thin film transistor T6 may be electrically connected to the pixel electrode of the OLED. The first emission control thin film transistor T5 and the second emission control thin film transistor T6 are concurrently (e.g., simultaneously) turned on in response to an emission control signal En transferred via the emission control line EL, a driving voltage ELVDD is transferred to the OLED, and a driving current flows through the OLED.

A gate electrode of the second initialization thin film transistor T7 may be connected to a third scan line SLn+1. A source electrode of the second initialization thin film transistor T7 may be connected to the pixel electrode of the OLED. A drain electrode of the second initialization thin film transistor T7 may be connected to the initialization voltage line VL. The second initialization thin film transistor T7 is turned on in response to a third scan signal Sn+1 transferred via the third scan line SLn+1 and may initialize the pixel electrode of the OLED.

The other electrode of the storage capacitor Cst may be connected to the driving voltage line PL. One of the electrodes of the storage capacitor Cst may be concurrently (e.g., simultaneously) connected to the gate electrode of the driving thin film transistor T1, the drain electrode of the compensation thin film transistor T3, and the source electrode of the first initialization thin film transistor T4.

An opposite electrode of the OLED is connected to a common power voltage ELVSS. The OLED emits light by receiving a driving current from the driving thin film transistor T1.

The pixel circuit PC is not limited to a number of thin film transistors, a number of storage capacitors, and the circuit design described with reference to FIGS. 3A and 3B, and a number of thin film transistors, a number of storage capacitors, and the circuit design may be variously changed in a suitable manner.

Figure 4:
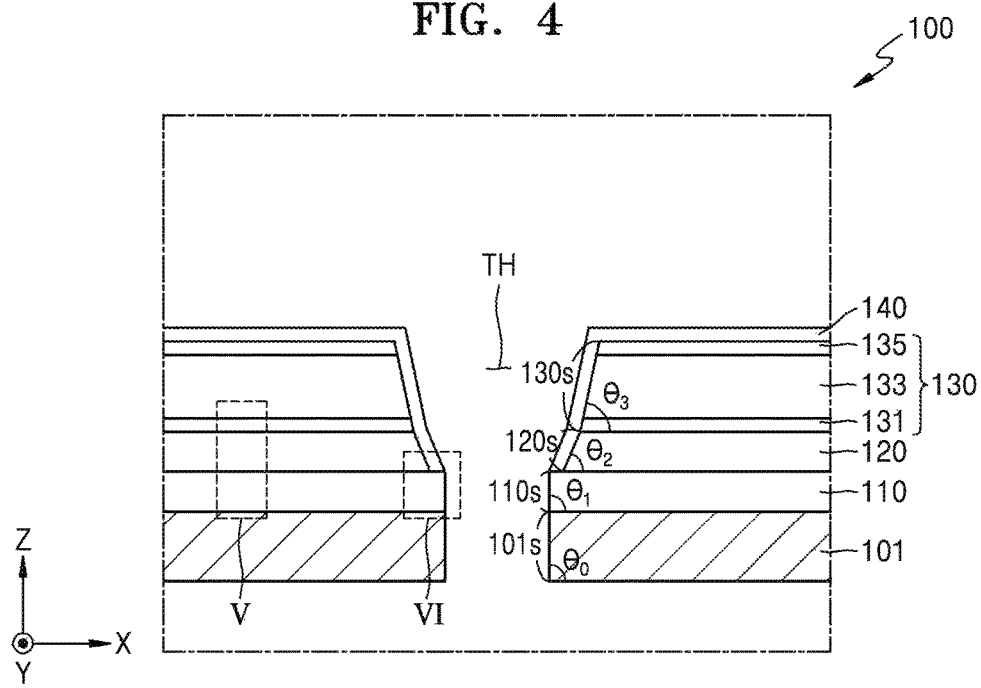
FIG. 4 is a cross-sectional view of the display device taken along the line IV-IV of FIG. 1.
Figure 5:
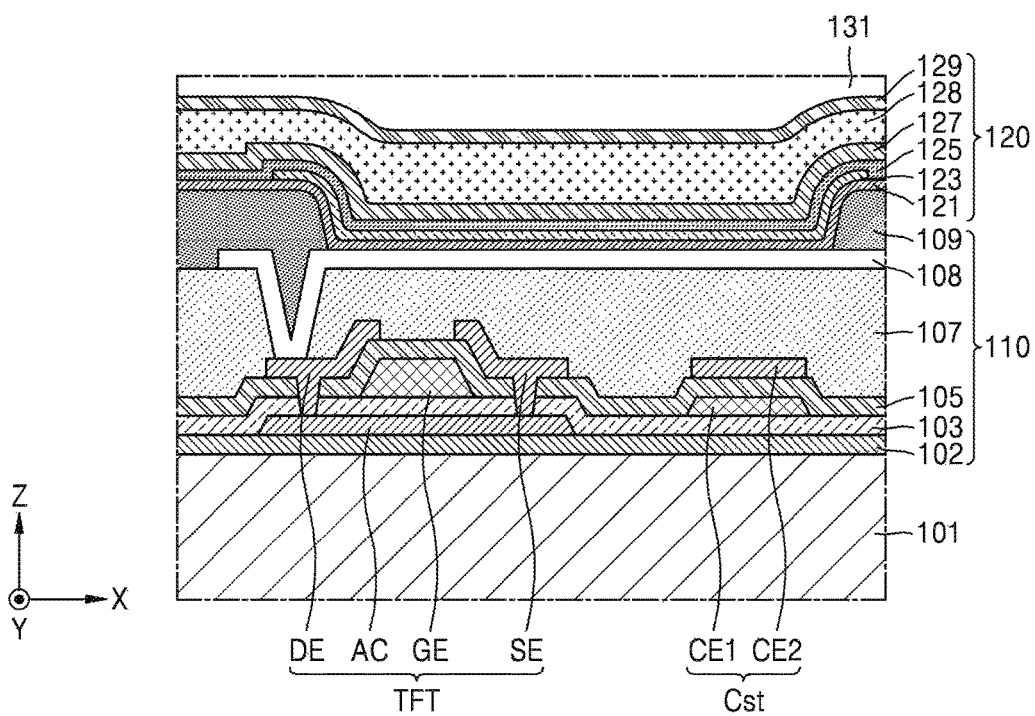
FIG. 5 is a cross-sectional view of the portion V of the display device of FIG. 4.
Figure 6:
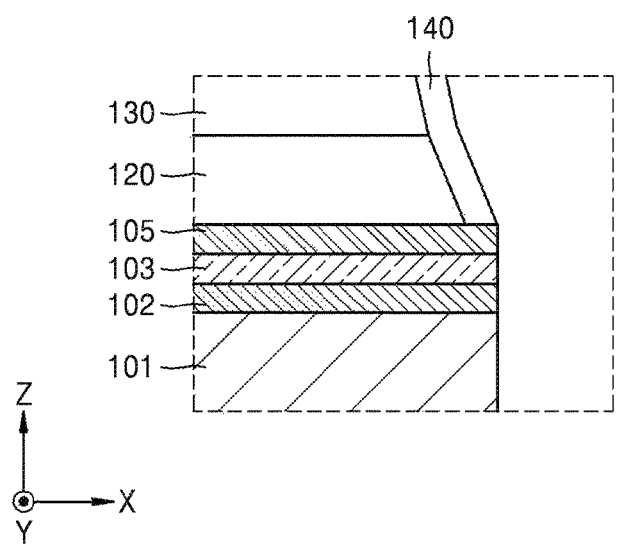
FIG. 6 is a cross-sectional view of the portion VI of the display device of FIG. 4.

FIG. 4 is a cross-sectional view of the display device 100 taken along the line IV-IV of FIG. 1. FIG. 5 is a cross-sectional view of a portion V of the display device 100 of FIG. 4. FIG. 6 is a cross-sectional view of a portion VI of the display device 100 of FIG. 4.

Referring to FIG. 4, the display device 100 may include a substrate 101, a circuit element layer 110, a display layer 120, a thin encapsulation layer 130, and an additional inorganic layer 140. A through portion TH may have a depth corresponding to the entire thickness of the display device 100. The through portion TH may pass through all layers ranging from the substrate 101 to the additional inorganic layer 140.

The substrate 101 may include various suitable materials including a glass material, metal, or a plastic material such as polyethylene terephthalate (PET), polyethylene naphthalate (PEN), and polyimide (PI). In the example in which the substrate 101 includes a plastic material, the substrate 101 may have improved flexibility as compared with an example in which the substrate 101 includes a glass material.

The circuit element layer 110 includes the pixel circuit PC including the thin film transistors and the pixel electrode connected to the pixel circuit PC described with reference to FIGS. 3A to 3B.

The display layer 120 includes an emission layer, an opposite electrode, and a functional layer. When a hole and an electron respectively injected from the pixel electrode of the circuit element layer 110 and the opposite electrode of the display layer 120 recombine in the emission layer, an exciton is generated. While the exciton falls from an excited state to a ground state, the exciton emits light.

The circuit element layer 110 and the display layer 120 are described below.

Referring to FIG. 5, the circuit element layer 110 includes a thin film transistor (TFT), a storage capacitor Cst, and a pixel electrode 108 electrically connected to the TFT and the storage capacitor Cst. As illustrated in FIG. 5, the TFT includes a semiconductor layer AC, a gate electrode GE, a source electrode SE, and a drain electrode DE. The storage capacitor Cst includes a first electrode CE1 and a second electrode CE2 overlapping each other. The first electrode CE1 and the second electrode CE2 are respectively arranged in layers in which the gate electrode GE and the source and drain electrodes SE and DE are arranged.

The semiconductor layer AC may include polysilicon or amorphous silicon. In another embodiment, the semiconductor layer AC may include an oxide of at least one of In, Ga, Sn, Zr, V, Hf, Cd, Ge, Cr, Ti, Zn, and/or the like. For example, the semiconductor layer AC may include an oxide semiconductor, such as indium gallium zinc oxide (IGZO), zinc tin oxide (ZTO), and zinc indium oxide (ZIO), and/or the like, or an organic semiconductor.

The gate electrode GE may be a single layer or multiple layers including Al, Pt, Pd, Ag, Mg, Au, Ni, Nd, Ir, Cr, Li, Ca, Mo, Ti, W, Cu, and/or the like. The first electrode CE1 is arranged in the same layer as that of the gate electrode GE and may include the same or substantially the same material as that of the gate electrode GE.

The source and drain electrodes SE and DE may be a single layer or multiple layers including a material having excellent conductivity. For example, the source and drain electrodes SE and DE may include Al, Pt, Pd, Ag, Mg, Au, Ni, Nd, Ir, Cr, Li, Ca, Mo, Ti, W, Cu, and/or the like. In other embodiments, the source and drain electrodes SE and DE may be triple layers of Ti/Al/Ti. The second electrode CE2 may be arranged in layers in which the source and drain electrodes SE and DE are arranged and may include the same or substantially the same material as those of the source and drain electrodes SE and DE.

A buffer layer 102 is between the substrate 101 and the semiconductor layer AC. A gate insulating layer 103 is between the semiconductor layer AC and the gate electrode GE. An interlayer insulating layer 105 is between the first and second electrodes CE1 and CE2 and between the gate electrode GE and the source and drain electrodes SE and DE. A planarization insulating layer 107 is below the pixel electrode 108.

The buffer layer 102 and the gate insulating layer 103 may be a single layer or multiple layers including an inorganic material such as SiNx and/or SiOx. The interlayer insulating layer 105 may be a single layer or multiple layers including an inorganic material such as SiOx, SiNx, $Al_2O_3$, and/or the like. The planarization insulating layer 107 may include an organic material including a general-purpose polymer such as polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, a blend thereof, and/or the like. However, the embodiments are not limited thereto. In another embodiment, the planarization insulating layer 107 may have multiple layers including an inorganic material and an organic material.

For convenience of description, according to the present embodiment, a top-gate type TFT is illustrated having the gate electrode GE above the semiconductor layer AC. However, in another embodiment, the TFT may include a bottom-gate type TFT.

According to the present embodiment, the first electrode CE1 is arranged in the layer in which the gate electrode GE is arranged and includes the same or substantially the same material as that of the gate electrode GE, and the second electrode CE2 is arranged in the layer in which the source and drain electrodes SE and DE are arranged and includes the same or substantially the same material as those of the source and drain electrodes SE and DE. However, this is merely provided as an example. In another embodiment, in high resolution, to increase the channel length of a TFT, for example, the driving TFT, and to increase the capacitance of the storage capacitor Cst, the storage capacitor Cst may overlap the TFT above the TFT. For example, the gate electrode GE of the TFT and the first electrode CE1 of the storage capacitor Cst may be the same electrode. That is, the gate electrode GE of the TFT overlapping the semiconductor layer AC with the gate insulating layer 103 disposed therebetween may also perform the function of the first electrode CE1 of the storage capacitor Cst.

The pixel electrode 108 includes various suitable conductive materials. The pixel electrode 108 may include a reflective layer including Ag, Mg, Al, Pt, Pd, Au, Ni, Nd, Ir, Cr, a compound thereof, and/or the like. In other examples, the pixel electrode 108 may include the reflective layer and a transparent conductive oxide (TCO) layer above and/or below the reflective layer. The pixel electrode 108 may correspond to each pixel.

A pixel-defining layer 109 is above the pixel electrode 108, covers the edge of the pixel electrode 108, and exposes the pixel electrode 108. The pixel-defining layer 109 may include an organic insulating layer and an inorganic insulating layer, or include only one of an organic insulating layer and an inorganic insulating layer.

The display layer 120 is above the circuit element layer 110. The display layer 120 includes an emission layer 123 and an opposite electrode 127 facing the pixel electrode 108 with the emission layer 123 disposed therebetween. The display layer 120 includes functional layers 121 and 125 arranged in at least one of a space between the pixel electrode 108 and the emission layer 123 and a space between the emission layer 123 and the opposite electrode 127. The display layer 120 may include a capping layer 128 and/or an inorganic barrier layer 129.

The emission layer 123 may emit one of red, green, and blue light depending on corresponding pixels. The emission layer 123 may be arranged at each pixel such as a red, a green, and a blue light-emitting pixel. A first function layer 121 and a second function layer 125 are arranged respectively below and above the emission layer 123.

The first functional layer 121 is between the pixel electrode 108 and the emission layer 123. The first functional layer 121 may include a hole transport layer (HTL) and a hole injection layer (HIL). The second functional layer 125 is between the emission layer 123 and the opposite electrode 127. The second functional layer 125 may include an electron transport layer (ETL) and an electron injection layer (EIL). The first and second functional layers 121 and 125 are common to pixels. For example, each of the first and second functional layers 121 and 125 may be arranged over the entire surface of the display area DA (e.g., see FIG. 1).

The emission layer 123 and the first and second functional layers 121 and 125 may include a low molecular organic material or a polymer material. In the example in which the emission layer 123 and the first and second functional layers 121 and 125 include a low molecular organic material, they may include various suitable organic materials such as copper phthalocyanine (CuPc), N,N'-Di(naphthalene-1-yl)-N,N'-diphenyl-benzidine (NPB), tris-8-hydroxyquinoline aluminum (Alq3), and/or the like. In the example in which the emission layer 123 and the first and second functional layers 121 and 125 include a polymer material, the first functional layer 121 may mostly include an HTL. The HTL may include PEDOT, and the emission layer 123 may include a polymer material such as a poly-phenylenevinylene (PPV)-based material and a polyfluorene-based material, however, this is merely provided as an example, and the embodiment is not limited thereto.

Though FIG. 5 illustrates the example in which the first and second functional layers 121 and 125 are respectively arranged below and above the emission layer 123, this is merely provided as an example, and the display layer 120 may include only one of the first and second functional layers 121 and 125.

The opposite electrode 127 may have one unified body and cover the display area DA (e.g., see FIG. 1) of the substrate 101. The opposite electrode 127 may be a semi-transmissive thin metal layer including at least one metal having a small work function, such as Li, Ca, LiF/Ca, LiF/Al, Al, Mg, Ag, an alloy of Ag and Mg, and/or the like. In some examples, the opposite electrode 127 may include a transparent conductive oxide layer such as ITO, IZO, ZnO, $In_2O_3$, IGO, AZO, and/or the like. In other examples, the opposite electrode 127 may have multiple layers in which the above-mentioned layers are stacked.

The capping layer 128 may protect the layers below the capping layer 128. For example, the capping layer 128 may protect the opposite electrode 127, the emission layer 123, and the first and second functional layers 121 and 125. The capping layer 128 may be a single layer or multiple layers including an organic material and/or an inorganic material.

The inorganic barrier layer 129 may include LiF. The inorganic barrier layer 129 may prevent or reduce (e.g., minimize) damage to the layers arranged therebelow (e.g. the emission layer) by high energy of oxygen radicals generated during a process of forming the thin encapsulation layer 130 (which will be described below), for example, a process of forming a first inorganic layer 131, which may be performed via a plasma chemical vapor deposition process.

Referring to FIG. 4 again, the thin encapsulation layer 130 includes at least one inorganic layer and at least one organic layer. For example, the thin encapsulation layer 130 may include a first inorganic layer 131 and a second inorganic layer 135, and an organic layer 133 therebetween.

The first and second inorganic layers 131 and 135 may include AlN, $Al_2O_3$, TiN, $TiO_2$, SiON, SiNx, SiOx, and/or the like. The first and second inorganic layers 131 and 135 may protect the display layer 120 from moisture.

The organic layer 133 may include a polymer-based material such as PMMA, polycarbonate (PC), PS, an acryl-based polymer, an epoxy-based polymer, polyimide, polyethylene (PE), and/or the like. The organic layer 133 may be thicker than the first and second inorganic layers 131 and 135. The organic layer 133 may relieve internal stress of the first and second inorganic layers 131 and 135, compensate for a defect of the first and second inorganic layers 131 and 135, and planarize the first and second inorganic layers 131 and 135.

The additional inorganic layer 140 is above the thin encapsulation layer 130. An end of the additional inorganic layer 140, for example, an end of the additional inorganic layer 140 adjacent to the through portion TH, extends and covers a lateral surface 130s of the thin encapsulation layer 130 and a lateral surface 120s of the display layer 120. As illustrated in FIG. 6, the additional inorganic layer 140 may contact the interlayer insulating layer 105 of the circuit element layer 110. In the example in which the additional inorganic layer 140 contacts the interlayer insulating layer 105 including an inorganic material, the additional inorganic layer 140 may improve an encapsulation characteristic by preventing or substantially preventing lateral moisture transmission of the display device 100.

As illustrated in FIG. 4, the inner lateral surface of the through portion TH may be determined by the additional inorganic layer 140 covering the lateral surfaces 120s and 130s of the display layer 120 and the thin encapsulation layer 130, a lateral surface 110s of the circuit element layer 110, and a lateral surface 101s of the substrate 101. Thus, the through portion TH may be defined by the additional inorganic layer 140 covering the lateral surfaces 120s and 130s of the display layer 120 and the thin encapsulation layer 130, the lateral surface 110s of the circuit element layer 110, and the lateral surface 101s of the substrate 101.

In the present specification, "the lateral surface of a layer A" denotes a side connecting the undermost end of the layer A to the uppermost end of the layer A including a single layer or multiple layers, and "the slope angle of the lateral surface of the layer A" denotes the tapered angle of the above-described side. In the example in which the layer A is a single layer, the lateral surface of the layer A is arranged on the same plane as the lateral surface of the layer forming the layer A. In the example in which the layer A is multiple layers, the lateral surface of the layer A may be arranged on the same layer as each of the lateral surfaces of the plurality of layers forming the layer A, or may be arranged on a different plane. That is, the lateral surface of the layer A and the lateral surface of each of the plurality of layers forming the layer A should be understood as different concepts.

Therefore, "the lateral surface of the substrate 101 adjacent to the through portion TH" denotes the surface 101s connecting the undermost end of the substrate 101 adjacent to the through portion TH to the uppermost end of the substrate 101. "The slope angle of the lateral surface 101s of the substrate 101 adjacent to the through portion TH" denotes a tapered angle $\theta_0$ of the surface 101s. "The lateral surface of the circuit element layer 110 adjacent to the through portion TH" denotes the surface 110s connecting the undermost end of the circuit element layer 110 adjacent to the through portion TH to the uppermost end of the circuit element layer 110. "The slope angle of the lateral surface 110s of the circuit element layer 110 adjacent to the through portion TH" denotes a tapered angle $\theta_1$ of the surface 110s. Likewise, "the lateral surface of the display layer 120 adjacent to the through portion TH" denotes the surface 120s connecting the undermost end of the display layer 120 adjacent to the through portion TH to the uppermost end of the display layer 120. "The slope angle of the lateral surface 120s of the display layer 120 adjacent to the through portion TH" denotes a tapered angle $\theta_2$ of the surface 120s. Also, "the lateral surface of the thin encapsulation layer 130 adjacent to the through portion TH" denotes the surface 130s connecting the undermost end of the thin encapsulation layer 130 adjacent to the through portion TH to the uppermost end of the thin encapsulation layer 130. "The slope angle of the lateral surface 130s of the thin encapsulation layer 130 adjacent to the through portion TH" denotes a tapered angle $\theta_3$ of the surface 130s.

The slope angles $\theta_0$, $\theta_1$, $\theta_2$, and $\theta_3$ of the lateral surfaces of the layers 101, 110, 120, and 130 of the display device 100 may have different values due to a process of forming the through portion TH. In the case of using mechanical polishing which uses a polishing tape and a tip as a partial process of forming the through portion TH, the slope angle of at least one of the layers 101, 110, 120, and 130, for example, the slope angles $\theta_2$ and $\theta_3$ of the display layer 120 and the thin encapsulation layer 130 have values different from the slope angles of the lateral surfaces of the other layers, for example, the slope angles $\theta_0$ and $\theta_1$ of the substrate 101 and the circuit element layer 110.

FIGS. 7A to 7D are cross-sectional views illustrating a method of manufacturing a display device according to an embodiment.

Figure 7A:
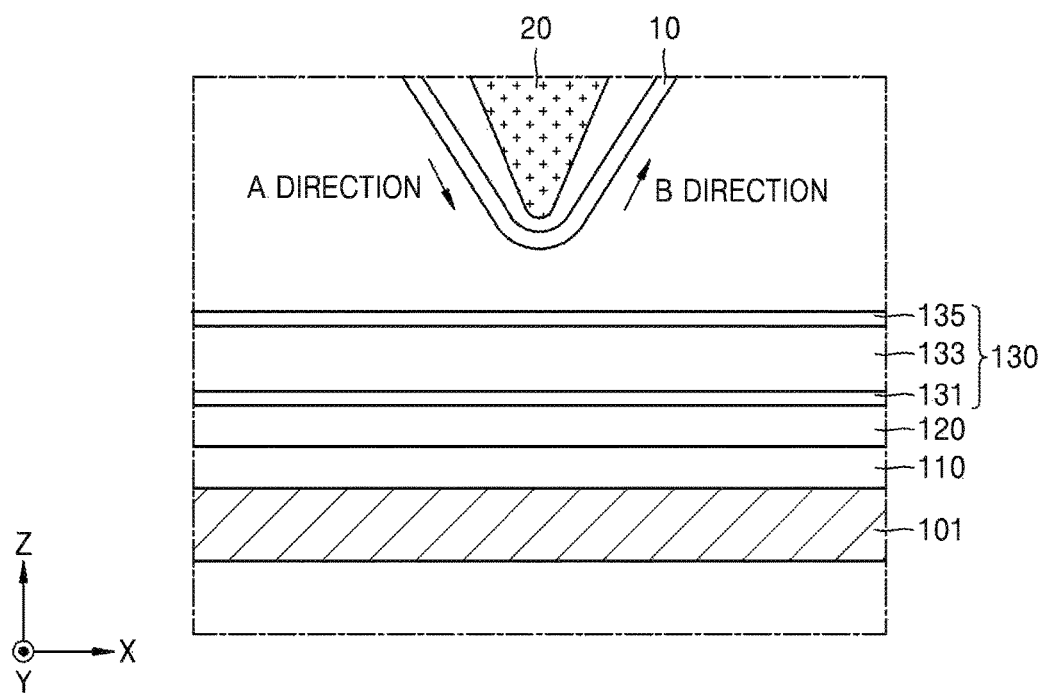
FIGS. 7A-7D are cross-sectional views illustrating a method of manufacturing a display device according to an example embodiment.

Referring to FIG. 7A, the circuit element layer 110, the display layer 120, and the thin encapsulation layer 130 are sequentially formed above the substrate 101. As described with reference to FIGS. 4 and 5, the circuit element layer 110 includes the TFT and the storage capacitor, and the pixel electrode connected to the TFT and the storage capacitor. The display layer 120 includes the emission layer 123, the opposite electrode 127, and the first and/or second functional layers 121 and 125. The display layer 120 may further include the capping layer 128 and the inorganic barrier layer 129. Because the materials of the substrate 101, the circuit element layer 110, the display layer 120, and the thin encapsulation layer 130 are the same or substantially the same as those described with reference to FIGS. 4 and 5, repeated descriptions thereof may not be provided. The layers of the display layer 120 may be formed by thermal evaporation. The first and second inorganic layers 131 and 135 of the thin encapsulation layer 130 may be formed by chemical vapor deposition (CVD). The organic layer 133 may be formed by forming a monomer and curing the monomer by using heat or light such as an ultraviolet ray.

Figure 7B:
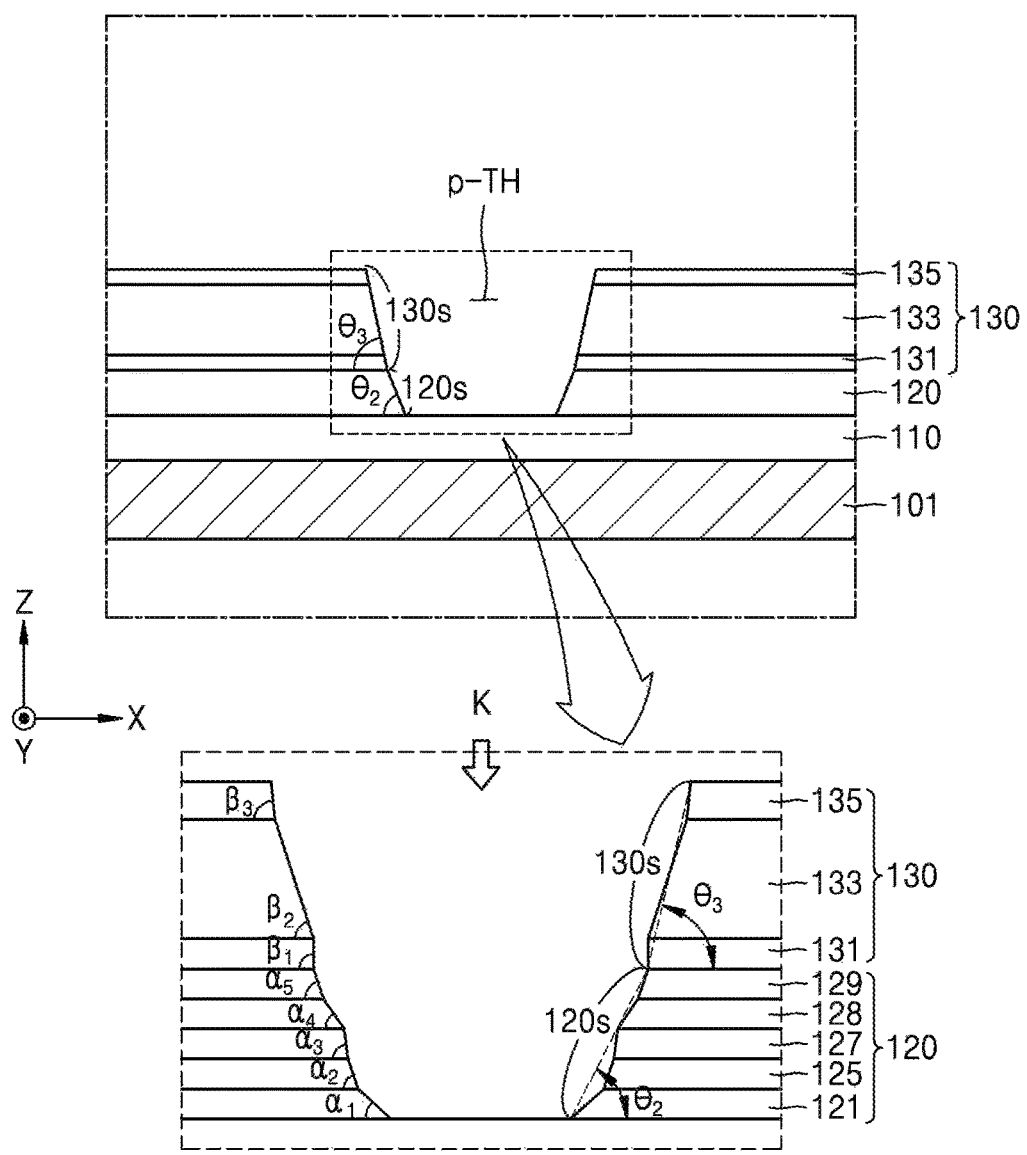

Referring to FIGS. 7A and 7B, a portion of layers including an organic material, a portion of the thin encapsulation layer 130, and a portion of the display layer 120 are removed by mechanical polishing that uses a polishing tape 10 and a tip 20 arranged above the thin encapsulation layer 130. While a portion of the thin encapsulation layer 130 and a portion of the display layer 120 are removed by mechanical polishing, a preliminary through portion p-TH passing through the thin encapsulation layer 130 and the display layer 120 is formed. The preliminary through portion p-PH may have a depth corresponding to the thickness of the thin encapsulation layer 130 and the display layer 120. The circuit element layer 110 may be exposed via the preliminary through portion p-TH.

Depending on mechanical polishing that uses the polishing tape 10 and the tip 20, the slope angle $\theta_2$ of the lateral surface 120s of the display layer 120 and the slope angle $\theta_3$ of the lateral surface 130s of the thin encapsulation layer 130 that are adjacent to the preliminary through portion p-TH may have different values. The slope angles $\theta_2$ and $\theta_3$ may have different values due to factors such as the shape of the tip 20, a polishing order, and that the layers of the display layer 120 and the thin encapsulation layer 130 include different materials such as an organic material or an inorganic material.

Referring to the enlarged view of FIG. 7B, respective layers forming the display layer 120 include different materials and may each have a slope angle having different values depending on the shape of the tip 20 and a polishing order. For example, a slope angle $\alpha_1$ of the lateral surface of the first functional layer 121, a slope angle $\alpha_2$ of the lateral surface of the second functional layer 125, a slope angle $\alpha_3$ of the lateral surface of the opposite electrode 127, a slope angle $\alpha_4$ of the lateral surface of the capping layer 128, and a slope angle $\alpha_5$ of the lateral surface of the inorganic barrier layer 129 may have different values. Likewise, a slope angle $\beta_1$ of the lateral surface of the first inorganic layer 131, a slope angle $\beta_2$ of the lateral surface of the organic layer 133, and a slope angle $\beta_3$ of the lateral surface of the second inorganic layer 135 may have different values.

Because the embodiments use a process of using the polishing tape 10 and the tip 20, when seen from the direction K of the enlarged view of FIG. 7B, the lateral surfaces of the organic layer 133 and the first inorganic layer 131, which are layers below the second inorganic layer 135, may be exposed via a region passing through the second inorganic layer 135. Likewise, when seen from the direction K of the enlarged view of FIG. 7B, the lateral surface of at least one of layers ranging from the capping layer 128 to the first functional layer 121, which are layers below the inorganic barrier layer 129, may be exposed via a region passing through the inorganic barrier layer 129. Likewise, at least one of layers below the capping layer 128, the opposite electrode 127, and the second functional layer 125 may be exposed via regions respectively passing through the capping layer 128, the opposite electrode 127, and the second functional layer 125.

The polishing tape 10 may be supplied from a polishing tape supplier to the thin encapsulation layer 130 along a direction "A" and, after forming the preliminary through portion p-TH, may move toward a polishing tape collector along a direction "B". As a comparative example of the embodiment, in the case of using a polisher rotating in place, replacement of the polisher is required depending on abrasion of the polisher during mass production, and productivity reduces as time taken for the replacement increases. However, in the case of using the polishing tape supplied in one direction according to the embodiment, because a process of replacing the polisher separately is omitted, manufacturing efficiency may improve.

Figure 7C:
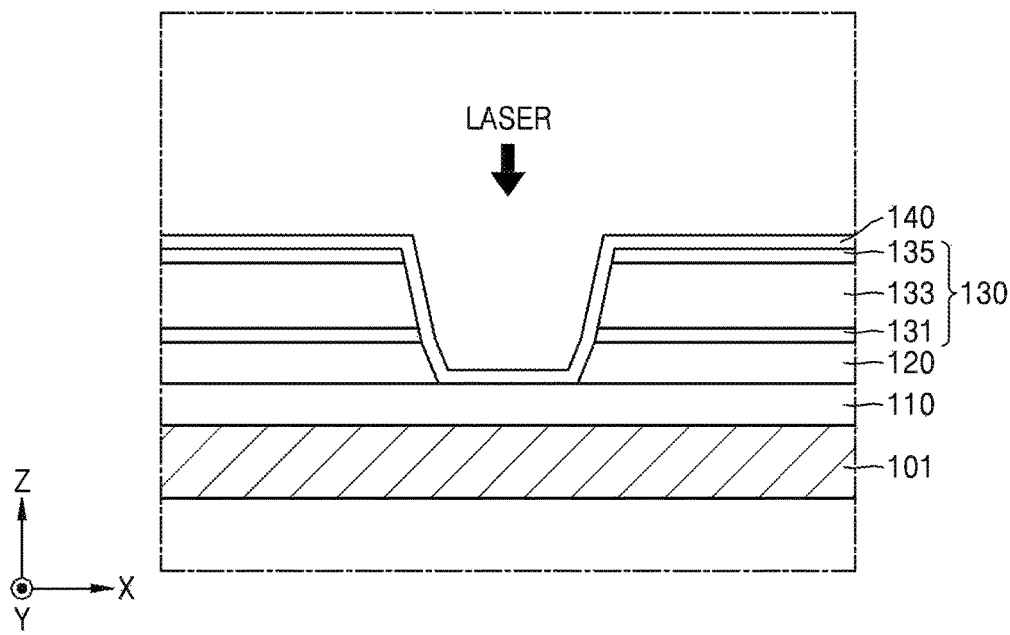

Referring to FIG. 7C, after forming the preliminary through portion p-TH, the additional inorganic layer 140 is formed. The additional inorganic layer 140 is formed above the entire surface of the substrate 101. For example, the additional inorganic layer 140 covers the upper surface of the thin encapsulation layer 130, the lateral surface 130s of the thin encapsulation layer 130, the lateral surface 120s of the display layer 120, and the upper surface of the circuit element layer 110 exposed via the preliminary through portion p-TH.

Figure 7D:
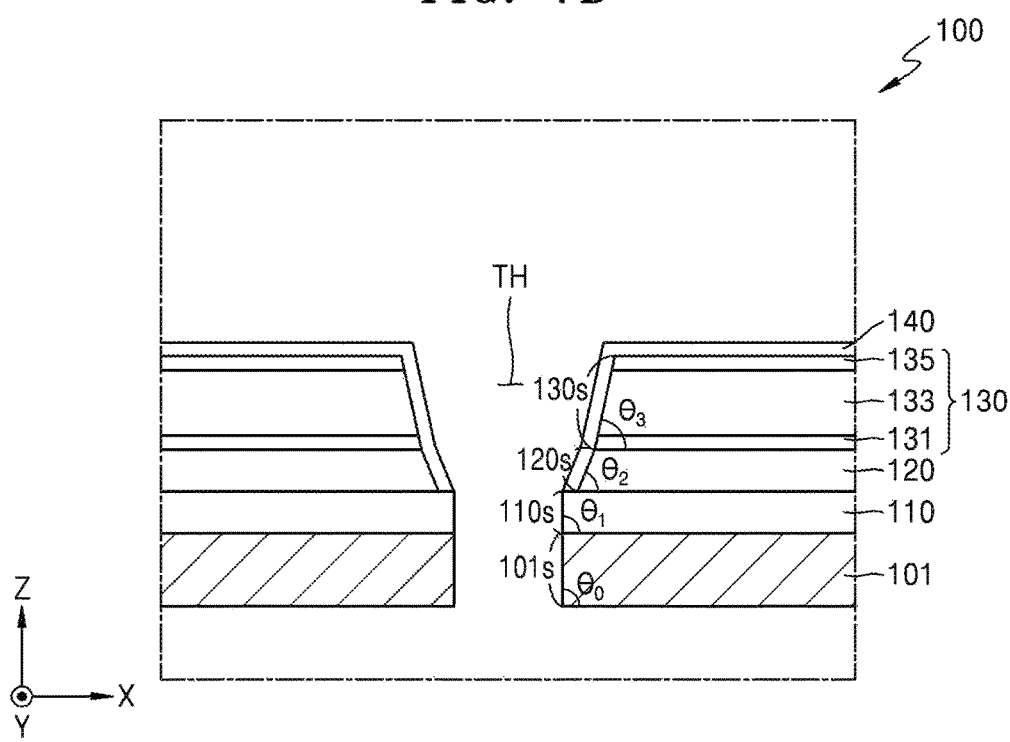

Referring to FIG. 7D, the through portion TH is formed by forming the additional inorganic layer 140, irradiating a laser beam to a location corresponding to the preliminary through portion p-PH, and removing a portion of the circuit element layer 110 and a portion of the substrate 101 that correspond to the preliminary through portion p-TH. The through portion TH may have a depth corresponding to the entire thickness of the display device 100.

The slope angles $\theta_1$ and $\theta_0$ respectively of the lateral surface 110s of the circuit element layer 110 and the lateral surface 101s of the substrate 101, which are formed by a laser process, are different from the slope angle $\theta_2$ of the lateral surface 120s of the display layer 120 and the slope angle $\theta_3$ of the lateral surface 130s of the thin encapsulation layer 130, which are formed by the above-described polishing process. The slopes angles $\theta_0$ and $\theta_1$ formed by the laser process may have values of about 90° or close to about 90° according to the depth of field (DOF) of the laser beam.

The through portion TH of the display device 100 described with reference to FIGS. 4 and 7A to 7D may be differentiated from the through portion formed by only the laser beam. In the case of forming a through portion by irradiating the laser beam right after forming the display device 100, the slope angles $\theta_2$ and $\theta_3$ may have substantially the same values due to the DOF of the laser beam. Also, in the area surrounding the through portion formed by the laser beam, denaturalization of the organic material may occur by heat generated while the laser is irradiated, a layer of the organic material may swell up, or the organic material may float, and moisture transmission in the lateral direction (e.g., an interface direction between a layer and a layer) may occur.

However, according to the manufacturing method described with reference to FIGS. 7A to 7D, because layers including the organic material, for example, the thin encapsulation layer 130 and the display layer 120 are removed by the mechanical polishing process and not by the laser process, denaturalization of the organic material by heat generated while the laser beam is irradiated, swelling of the layer of the organic material, or floating of the organic material may be prevented or substantially prevented.

The through portion TH of the display device 100 described with reference to FIGS. 4 and 7A to 7D may be discriminated from a through portion formed by a polisher rotating in place. As a comparative example of the embodiment, in the case of using a polisher rotating in place, polishing a plurality of layers is not easy, and even if the plurality of layers are polished, the lateral surfaces of the respective layers may not have slope angles of different values as in the present embodiment. Also, because it may not be easy to prevent the discharge burrs generated while the layers are polished on layers in the surrounding area of the through portion formed by the polisher rotating in place, the burrs may adhere to the inner diameter of the through portion due to frictional heat during the polishing.

Figure 8:
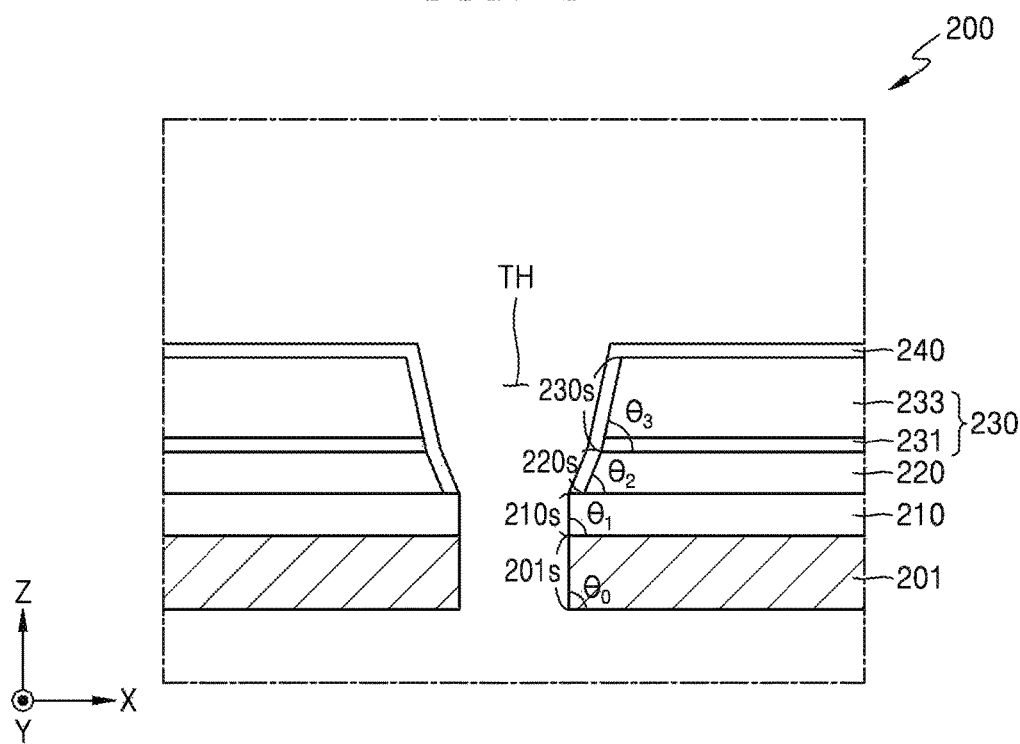
FIG. 8 is a cross-sectional view of a display device according to another example embodiment.

FIG. 8 is a cross-sectional view of a display device 200 according to another embodiment.

Referring to FIG. 8, the display device 200 includes a substrate 201, a circuit element layer 210, a display layer 220, a thin encapsulation layer 230, and an additional inorganic layer 240. Because the substrate 201, the circuit element layer 210, the display layer 220, and the additional inorganic layer 240 are respectively the same as the substrate 101, the circuit element layer 110, the display layer 120, and the additional inorganic layer 140 described with reference to FIGS. 4 and 5, descriptions thereof may not be repeated.

In an embodiment, though the uppermost surface of the thin encapsulation layer 130 of the display device 100 may be the inorganic layer (e.g., the second inorganic layer) as described with reference to FIG. 4, the embodiment is not limited thereto. In another embodiment, the uppermost surface of the thin encapsulation layer 230 illustrated in FIG. 8 may be an organic layer 233. Though the uppermost surface of the thin encapsulation layer 230 is the organic layer 233, because the additional inorganic layer 240 is arranged above the thin encapsulation layer 230, the display layer 220 may be protected from moisture, and/or the like The thin encapsulation layer 230 may include an inorganic layer 231 and the organic layer 233. The inorganic layer 231 and the organic layer 233 respectively include the same or substantially the same materials as those of the first inorganic layer 131 and the organic layer 133 described above with reference to FIG. 4.

The slope angles $\theta_0$, $\theta_1$, $\theta_2$, and $\theta_3$ of the lateral surfaces of layers 201, 210, 220, and 230 of the display device 200 according to the present embodiment may have different values as a result of a process of forming the through portion TH. In the case of using mechanical polishing that uses a polishing tape and a tip as a process of forming the through portion TH, the slope angles $\theta_0$, $\theta_1$, $\theta_2$, and $\theta_3$ of the lateral surfaces of layers 201, 210, 220, and 230 have different values.

Because the display device 200 illustrated in FIG. 8 is manufactured by substantially the same process as the process described with reference to FIGS. 7A and 7B, repeated descriptions thereof may not be provided.

Figure 9:
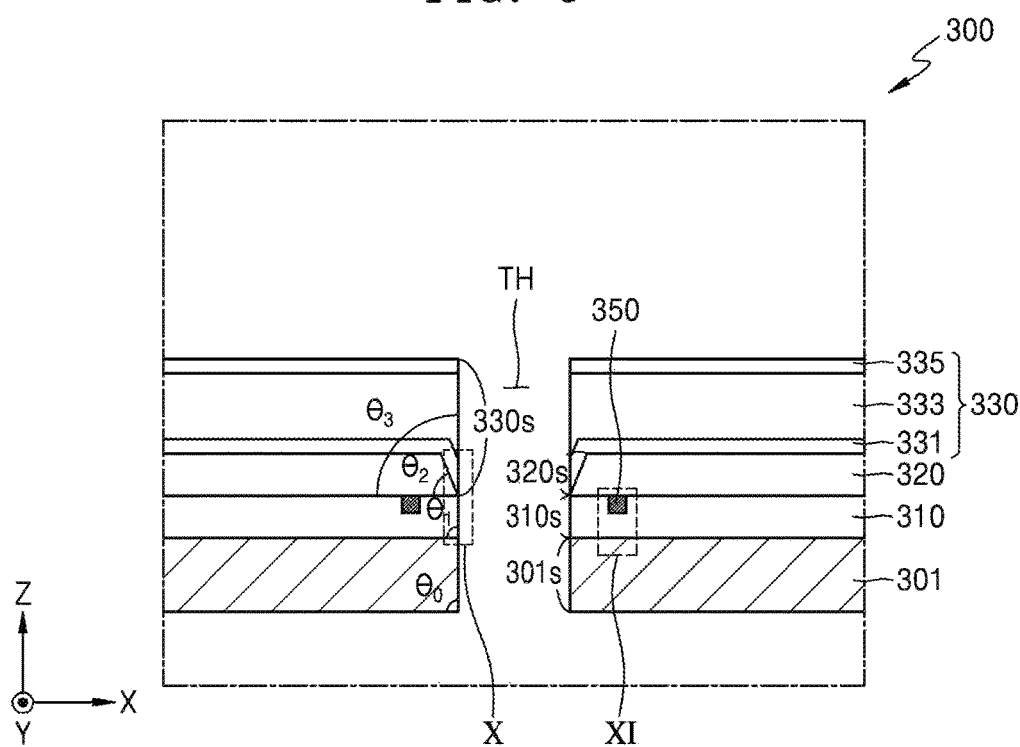
FIG. 9 is a cross-sectional view of a display device according to another example embodiment.
Figure 10:
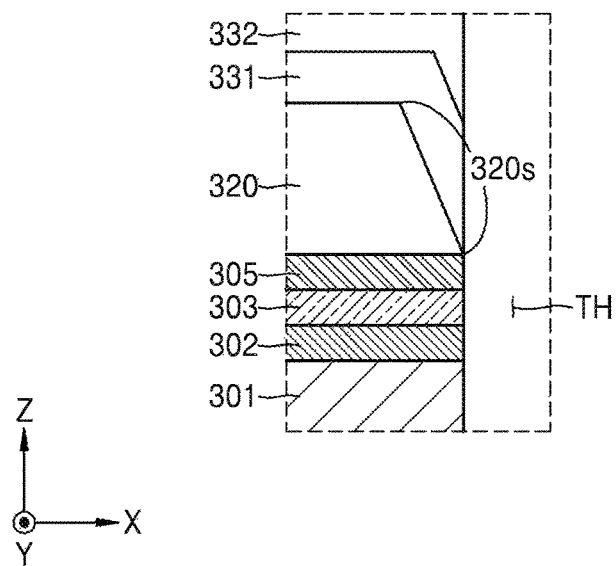
FIG. 10 is an enlarged view of the portion X of the display device of FIG. 9.
Figure 11:
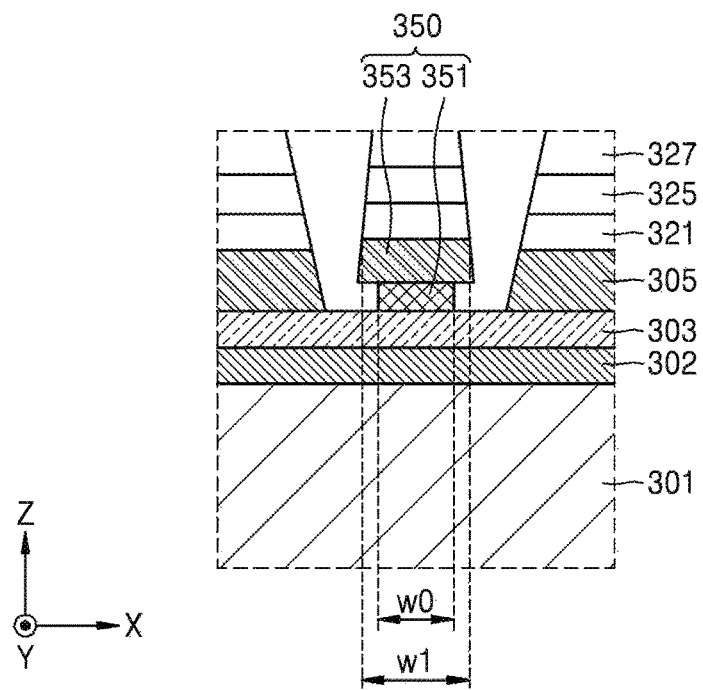
FIG. 11 is an enlarged view of the portion XI of the display device of FIG. 9.

FIG. 9 is a cross-sectional view of a display device 300 according to another embodiment, FIG. 10 is an enlarged view of a portion X of the display device 300 of FIG. 9, and FIG. 11 is an enlarged view of a portion XI of the display device 300 of FIG. 9.

Referring to FIG. 9, the display device 300 includes a substrate 301, a circuit element layer 310, a display layer 320, a thin encapsulation layer 330, and a step difference portion 350.

Because the substrate 301, the circuit element layer 310, and the display layer 320 are respectively the same as the substrate 101, the circuit element layer 110, and the display layer 120 described above with reference to FIGS. 4 and 5, descriptions thereof may not be repeated.

The thin encapsulation layer 330 may include an organic layer 333 between first and second inorganic layers 331 and 335. The organic layers 133 and 233 of the thin encapsulation layers 130 and 230 of the display devices 100 and 200 are not directly exposed toward the through portion TH, however, the lateral surface of the organic layer 333 of the thin encapsulation layer 330 according to the present embodiment may be directly exposed toward the through portion TH.

Referring to FIG. 10, the first inorganic layer 331 may not directly contact an interlayer insulating layer 305 in the surrounding area of the through portion TH. In some examples, even when the first inorganic layer 331 directly contacts the interlayer insulating layer 305 in the surrounding area of the through portion TH, the first inorganic layer 331 may contact a very small area of the interlayer insulating layer 305. A buffer layer 302, a gate insulating layer 303, and the interlayer insulating layer 305 are inorganic layers and it is difficult for moisture to penetrate into an interface between these inorganic layers, however, because the first inorganic layer 331 covering the display layer 320 in the surrounding area of the through portion TH directly contacts the interlayer insulating layer 305 and does not seal a lateral surface 320s of the display layer 320, moisture, and/or the like may penetrate into the display layer 320. However, according to some embodiments, a step difference portion 350 is arranged adjacent to the through portion TH and may block a penetration path of moisture, and/or the like.

Referring to FIG. 11, the step difference portion 350 has an undercut shape. The step difference portion 350 includes a first layer 351 and a second layer 353 above the first layer 351, in which the first and second layers 351 and 353 have different widths. For example, the first layer 351 has a width w0 less than a width w1 of the second layer 353. The step difference portion 350 may be arranged below the display layer 320.

The first and second layers 351 and 353 include different materials. For example, the first layer 351 may include a metallic material and the second layer 353 may include an insulating material. The first layer 351 may include the same or substantially the same material as that of one of an electrode of the TFT and an electrode of the storage capacitor Cst described with reference to FIG. 5. In an embodiment, the first layer 351 may be arranged above the buffer layer 302 and the gate insulating layer 303 and may include the same or substantially the same material as that of the gate electrode described with reference to FIG. 5. Also, the second layer 353 may include the same or substantially the same material as that of the interlayer insulating layer 305.

Layers above the step difference portion 350, for example, the display layers 320 including a first functional layer 321, a second functional layer 325, and an opposite electrode 327 may be disconnected from each other by the undercut-shaped step difference portion 350. Even when moisture penetrates in the lateral direction of the display layer 320, for example, when moisture penetrates via an interface between the first functional layer 321, the second functional layer 325, and the opposite electrode 327, because a penetration path is blocked by the step difference portion 350, penetration of the moisture to a pixel may be prevented or substantially prevented.

Referring to FIG. 9 again, the slope angles $\theta_0$, $\theta_1$, $\theta_2$, and $\theta_3$ of lateral surfaces 301s, 310s, 320s, and 330s of the layers 301, 310, 320, and 330 of the display device 300 may have different values due to a process of forming the through portion TH. For example, in the case of using mechanical polishing that uses a polishing tape and a tip as a partial process of forming the through portion TH, the slope angle (e.g. the slope angle $\theta_2$ of the lateral surface 320s of the display layer 320) of one of the layers 301, 310, 320, and 330 may have a value different from the slope angles of the lateral surfaces of the other layers, for example, the slope angles $\theta_0$, $\theta_1$, and $\theta_3$ of the lateral surfaces 301s, 310s, and 330s of the substrate 301, the circuit element layer 310, and the thin encapsulation layer 330.

FIGS. 12A to 12D are cross-sectional views illustrating a process of manufacturing a display device according to an embodiment.

Figure 12A:
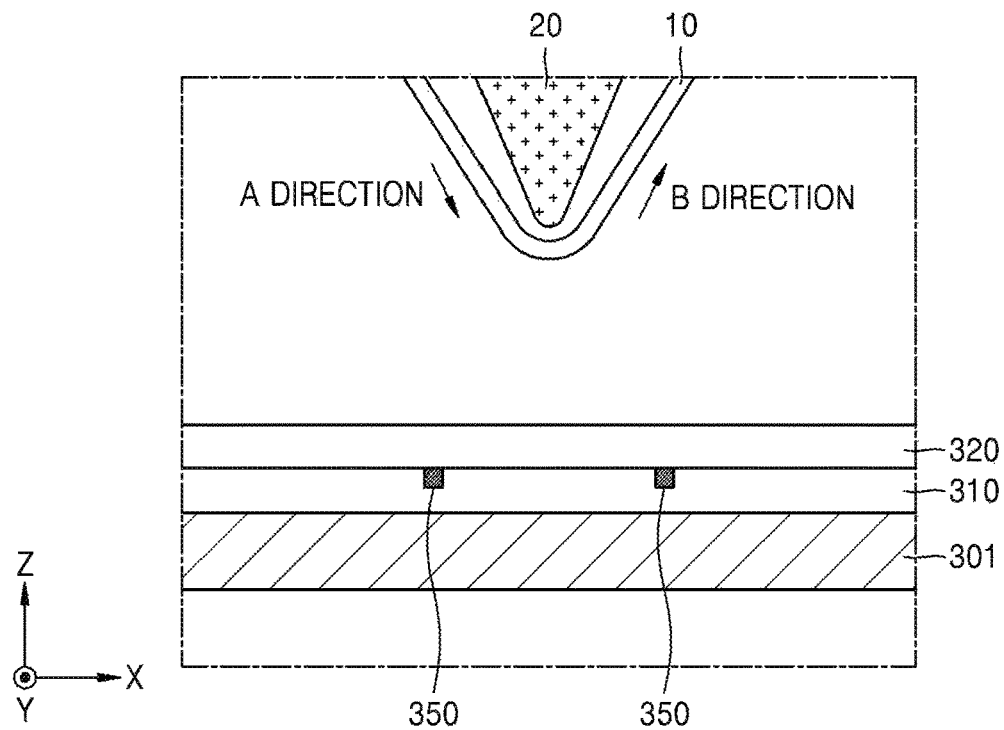
FIGS. 12A-12D are cross-sectional views illustrating a process of manufacturing a display device according to an example embodiment.

Referring to FIG. 12A, the circuit element layer 310 and the display layer 320 are sequentially formed above the substrate 301. The circuit element layer 310 includes a TFT, a storage capacitor, and a pixel electrode connected to the TFT and the storage capacitor. The display layer 320 includes an emission layer, an opposite electrode, a first functional layer and/or a second functional layer. The display layer 320 may further include a capping layer and/or an inorganic barrier layer. The materials of the substrate 301, the circuit element layer 310, and the display layer 320 are the same or substantially the same as those described with reference to FIGS. 4 and 5, and a manufacturing method thereof is the same or substantially the same as that described with reference to FIG. 7A.

A process of forming the circuit element layer 310 may include a process of forming a step difference portion 350. As described with reference to FIG. 11, the step difference portion 350 may include the first layer 351 and the second layer 353. The first layer 351 and the second layer 353 include the materials described above. In an embodiment, the undercut shape of the step difference portion 350 may be formed during an etching process of a pixel electrode. For example, while a metallic material forming the first layer 351 is etched by an etchant used for the etching process of the pixel electrode, the first layer 351 may have the width w0 less than the width w1 of the second layer 353.

Figure 12B:
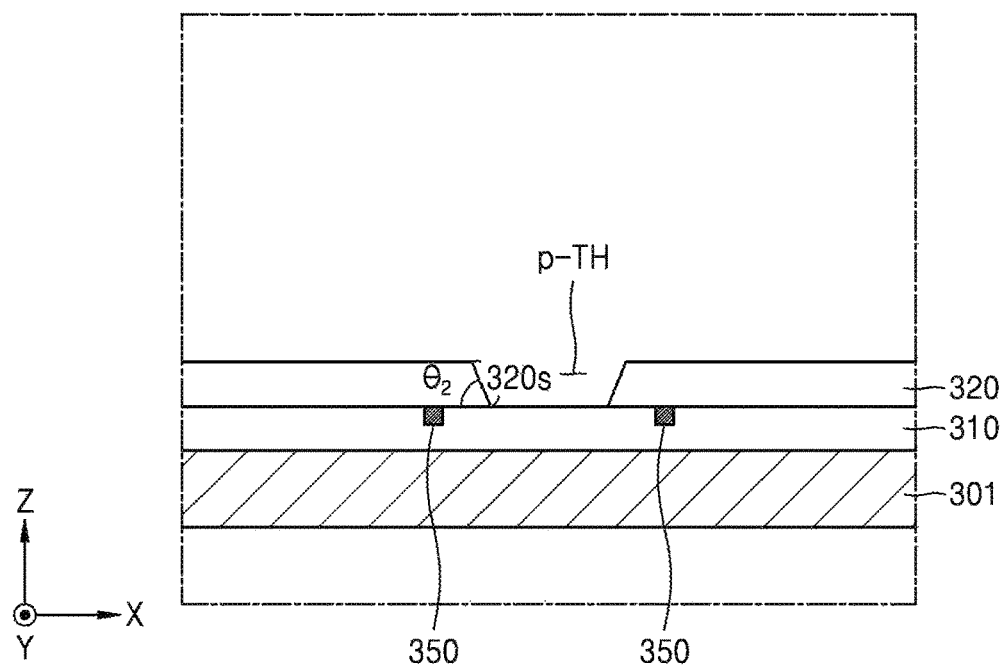

Referring to FIGS. 12A and 12B, a layer including an organic material, for example, a portion of the display layer 320, is removed by mechanical polishing that uses the polishing tape 10 and the tip 20 arranged above the display layer 320. The polishing tape 10 may be supplied from a polishing tape supplier to the display layer 320 along a direction "A" and, after forming the preliminary through portion p-TH, may move toward a polishing tape collector along a direction "B".

While a portion of the display layer 320 is removed by mechanical polishing, the preliminary through portion p-TH passing through the display layer 120 is formed. The preliminary through portion p-TH may have a depth corresponding to the thickness of the display layer 120. The circuit element layer 310 may be exposed via the preliminary through portion p-TH.

The lateral surface 320s of the display layer 320 may have a slope angle $\theta_2$ as a result of mechanical polishing that uses the polishing tape 10 and the tip 20. Though FIG. 12B illustrates only the slope angle $\theta_2$ of the lateral surface 320s of the display layer 320, as described with reference to FIG. 7B, respective layers forming the display layer 320 include different materials and have slopes (slope angles) of different values depending on the shape of the tip 20 and a polishing order, and layers therebelow may be exposed via a through region of one of the layers.

Figure 12C:
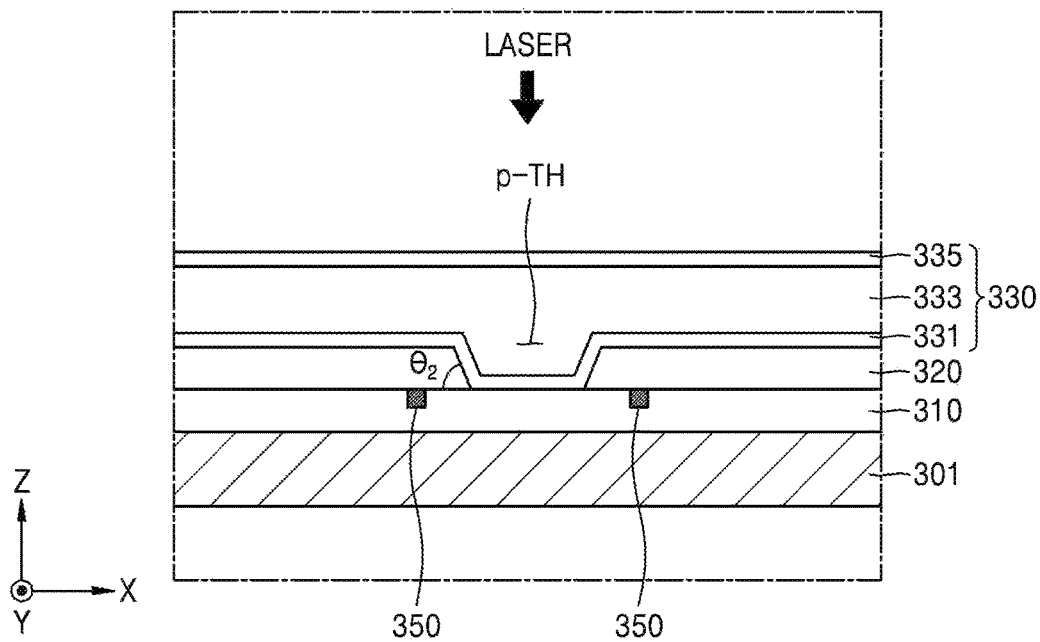

Referring to FIG. 12C, after forming the preliminary through portion p-TH, the thin encapsulation layer 330 is formed. The thin encapsulation layer 330 includes the first and second inorganic layers 331 and 335 and the organic layer 333 therebetween. The materials and the manufacturing process of the first and second inorganic layers 331 and 335 and the organic layer 333 are the same or substantially the same as those described above.

Figure 12D:
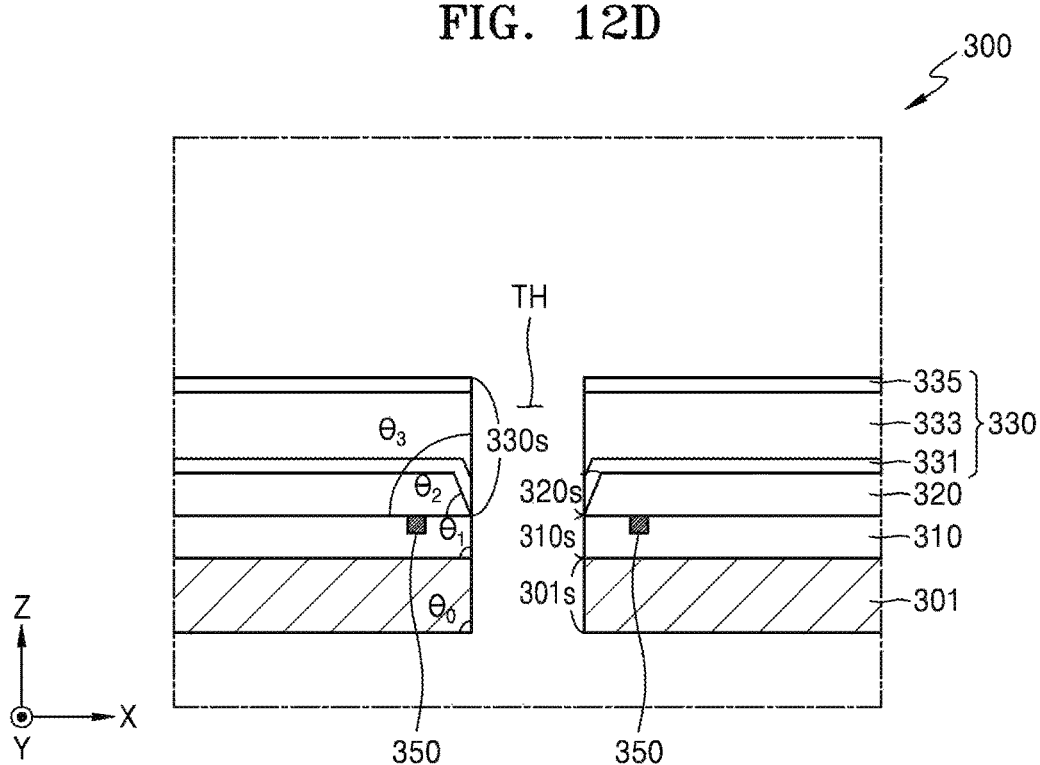

Referring to FIGS. 12C and 12D, the through portion TH is formed by irradiating a laser beam to a location corresponding to the preliminary through portion p-TH and removing a portion of the thin encapsulation layer 330, a portion of the circuit element layer 310, and a portion of the substrate 301 corresponding to the preliminary through portion p-TH. The through portion TH may have a depth corresponding to the entire thickness of the display device 300.

The slope angles $\theta_3$, $\theta_1$, and $\theta_0$ of the lateral surface 330s of respectively the thin encapsulation layer 330, the lateral surface 310s of the circuit element layer 310, and the lateral surface 301s of the substrate 301 formed by the laser process are different from the slope angle $\theta_2$ of the lateral surface 320s of the display layer 320 formed by the above polishing process. The slope angles $\theta_3$, $\theta_1$ and, $\theta_0$ formed by the laser process may have values of about 90° or close to about 90° according to the depth of field (DOF) of the laser beam.

Figure 13:
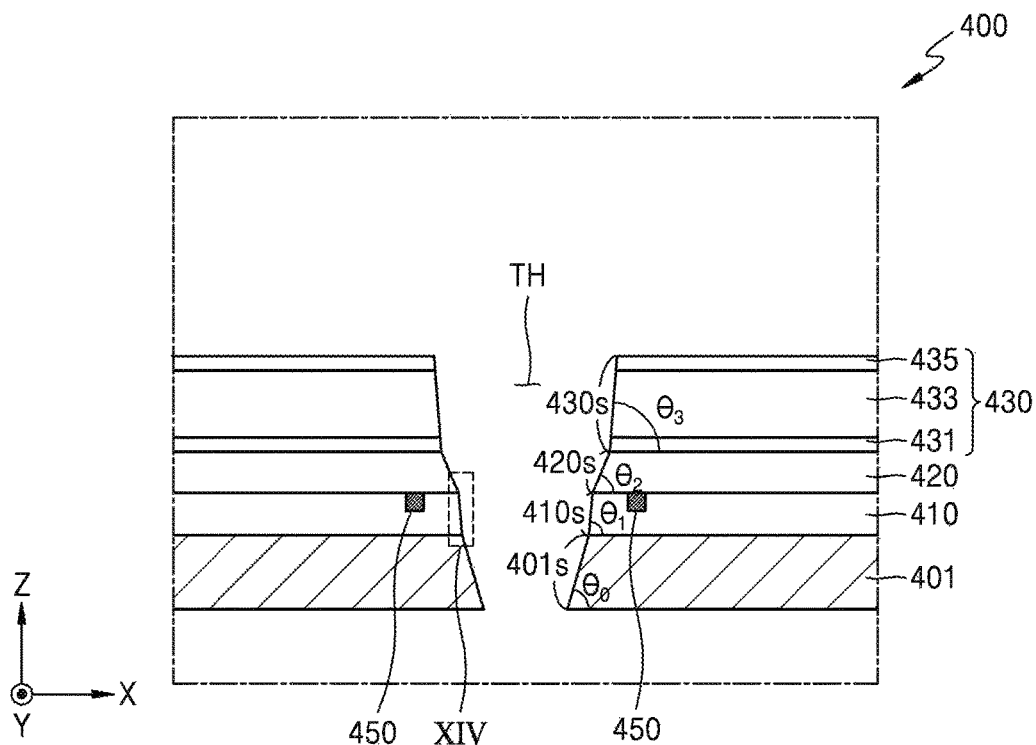
FIG. 13 is a cross-sectional view of a display device according to another example embodiment.
Figure 14:
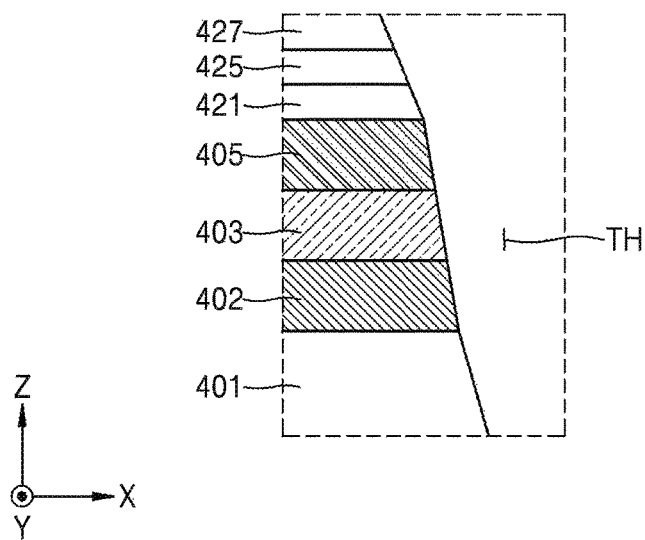
FIG. 14 is an enlarged view of the portion XIV of the display device of FIG. 13.

FIG. 13 is a cross-sectional view of a display device 400 according to another embodiment and FIG. 14 is an enlarged view of a portion XIV of the display device 400 of FIG. 13.

Referring to FIG. 13, the display device 400 includes a substrate 401, a circuit element layer 410, a display layer 420, a thin encapsulation layer 430, and a step difference portion 450.

Because the substrate 401, the circuit element layer 410, and the display layer 420 are respectively the same as the substrate 101, the circuit element layer 110, and the display layer 120 described with reference to FIGS. 4 and 5, descriptions thereof may not be repeated.

The thin encapsulation layer 430 may include first and second inorganic layers 431 and 435, and an organic layer 433 therebetween. Like the thin encapsulation layer 330 described above, the organic layer 433 of the thin encapsulation layer 430 may be directly exposed toward the lateral surface of the through portion TH.

In an embodiment, as illustrated in FIG. 14, the thin encapsulation layer 430 of the display device 400 does not directly contact an interlayer insulating layer 405 in the surrounding area of the through portion TH. That is, a first functional layer 421, a second functional layer 425, an opposite electrode 427, and/or the like of the display layer 420 may be directly exposed to the through portion TH. A buffer layer 402, a gate insulating layer 403, and an interlayer insulating layer 405 are inorganic layers and it is difficult for moisture to penetrate via an interface therebetween, however, because the display layer 420 is exposed, moisture, and/or the like may penetrate via an interface between layers forming the display layer 420. However, according to some embodiments, an undercut-shaped step difference portion 450 is arranged adjacent to the through portion TH and may block a penetration path of moisture, and/or the like. Because the step difference portion 450 has the same structure described above with reference to FIG. 10, a description thereof may not be repeated.

The slope angles $\theta_0$, $\theta_1$, $\theta_2$, and $\theta_3$ of the lateral surfaces of the layers 401, 410, 420, and 430 of the display device 400 may have different values due to a process of forming the through portion TH. For example, in the case of using mechanical polishing that uses a polishing tape and a tip for a process of forming the through portion TH, the slope angles $\theta_0$, $\theta_1$, $\theta_2$, and $\theta_3$ of the layers 401, 410, 420, and 430 may have different values.

Figure 15A:
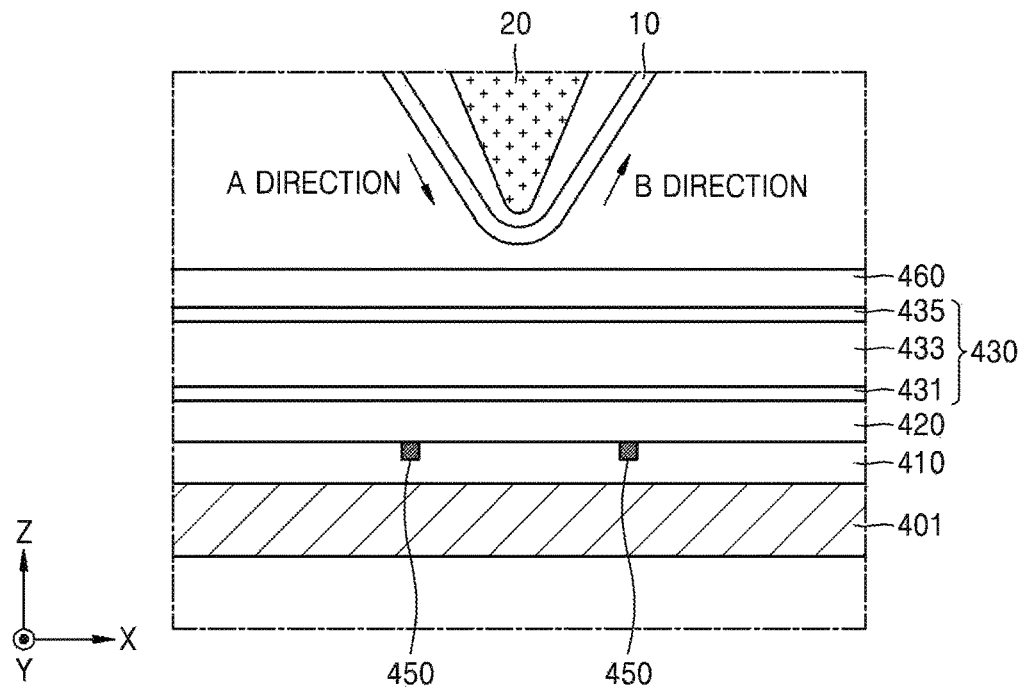
FIGS. 15A-15C are cross-sectional views illustrating a method of manufacturing a display device according to another example embodiment.
Figure 15B:
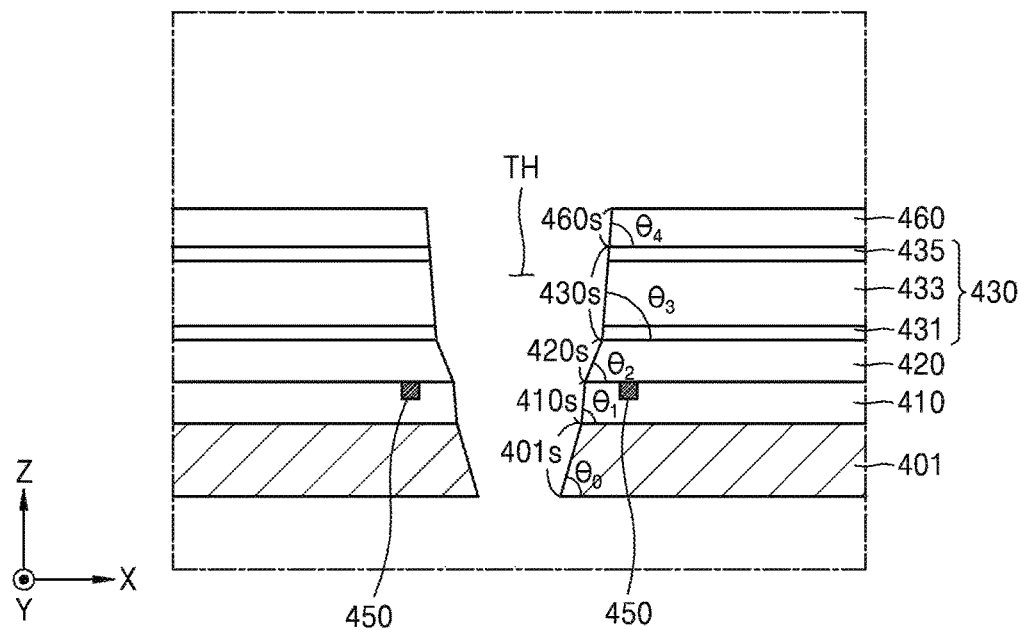
Figure 15C:
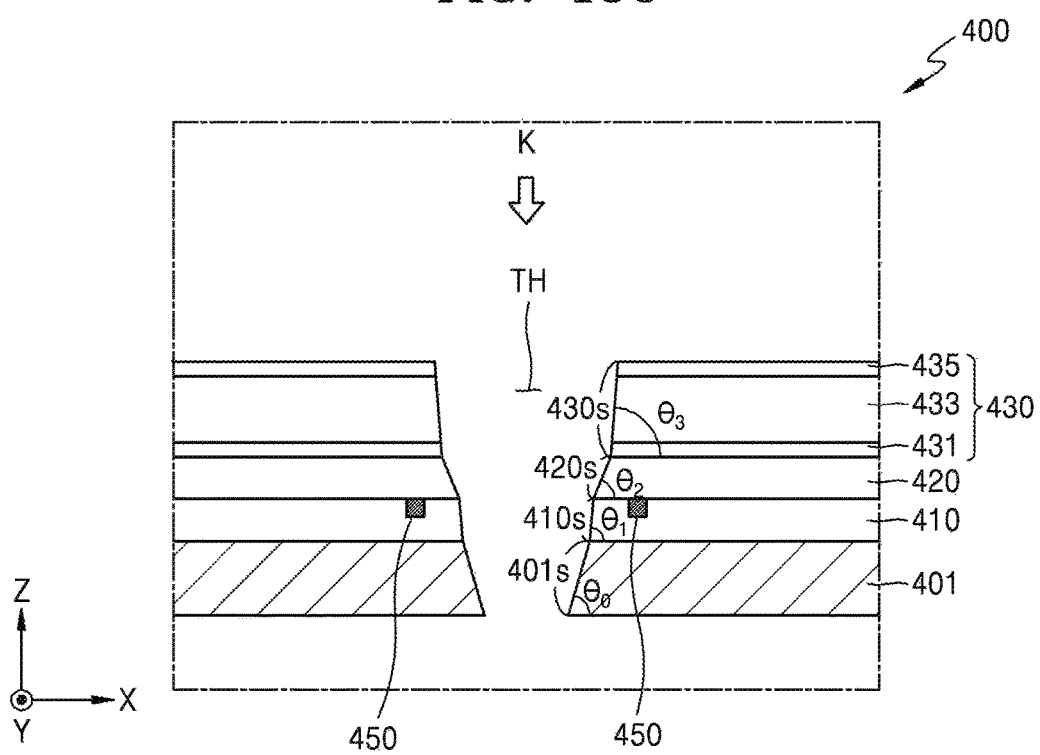

FIGS. 15A to 15C are cross-sectional views illustrating a method of manufacturing a display device according to another embodiment.

Referring to FIG. 15A, the circuit element layer 410, the display layer 420, and the thin encapsulation layer 430 are sequentially formed over the substrate 401. Also, a protective film layer 460 is formed on the thin encapsulation layer 430.

The circuit element layer 410 includes a TFT, a storage capacitor, and a pixel electrode connected to the TFT and the storage capacitor. The display layer 420 includes an emission layer, an opposite electrode, and first and/or second functional layers. The display layer 420 may further include a capping layer and/or an inorganic barrier layer. The thin encapsulation layer 430 includes the first and second inorganic layers 431 and 435, and the organic layer 433 therebetween. The materials of the substrate 401, the circuit element layer 410, the display layer 420, and the thin encapsulation layer 430 are the same or substantially the same as those described with reference to FIGS. 4 and 5, and the manufacturing method thereof is the same or substantially the same as that described with reference to FIG. 7A. As described with reference to FIG. 12A, a process of forming the circuit element layer 410 may further include a process of forming the step difference portion 450. The step difference portion 450 is the same or substantially the same as the step difference portion 350 described with reference to FIG. 11.

The protective film layer 460 protects the display device from foreign substances, and/or the like during the process. For example, the protective film layer 460 may include various suitable materials such as PET, PEN, PI, and/or the like.

Referring to FIGS. 15A and 15B, the through portion TH is formed by removing portions of the protective film layer 460, the thin encapsulation layer 430, the display layer 420, the circuit element layer 410, and the substrate 401 by mechanical polishing that uses the polishing tape 10 and the tip 20 arranged above the protective film layer 460. The polishing tape 10 may be supplied from a polishing tape supplier to the thin encapsulation layer 430 along a direction "A" and, after forming the through portion p-TH, may move toward a polishing tape collector along a direction "B".

The through portion TH formed by mechanical polishing has a depth corresponding to the entire thickness of the display device 400.

Depending on mechanical polishing that uses the polishing tape 10 and the tip 20, the slope angles of respective layers of the display device 400, for example, a slope angle $\theta_4$ of a lateral surface 460s of the protective film layer 460, a slope angle $\theta_3$ of a lateral surface 430s of the thin encapsulation layer 430, a slope angle $\theta_2$ of a lateral surface 420s of the display layer 420, a slope angle $\theta_1$ of a lateral surface 410s of the circuit element layer 410, and a slope angle $\theta_0$ of a lateral surface 401s of the substrate 401 may respectively have different values.

After that, as illustrated in FIG. 15C, the protective film layer 460 is removed.

Because the embodiments use a process of using the polishing tape 10 and the tip 20, when seen from a direction K of the enlarged view of FIG. 15C, the lateral surfaces of the display layer 420, the circuit element layer 410, and the substrate 401, which are layers below the thin encapsulation layer 430, may be exposed via a region passing through the thin encapsulation layer 430. The lateral surfaces of the circuit element layer 410 and the substrate 401 may be exposed via a region passing through the display layer 420. The lateral surface of the substrate 401 may be exposed via a region passing through the circuit element layer 410.

Also, like the description made with reference to the enlarged view of FIG. 7B, the slope angles of the respective layers (e.g. an inorganic barrier layer, a capping layer, an opposite electrode, a second functional layer, and a first functional layer) locally forming the display layer 420 may have different values and a layer (or layers) therebelow may be exposed via a through region of the respective layers. Similarly, the slope angles of respective layers forming the thin encapsulation layer 430, the circuit element layer 410, and the substrate 401 may have different values, and a layer (or layers) therebelow may be exposed via a through region of the respective layers.

Though the embodiments described with reference to FIGS. 14 and 15A to 15C have described the example in which a mechanical polishing process using the polishing tape 10 and the tip 20 is performed in a direction from the protective film layer 460 to the substrate 401, according to another embodiment, the mechanical polishing process may be performed in a direction from the substrate 401 to the protective film layer 460. Even in this case, similarly with the above embodiment, the slope angles of respective layers may have different values.

It will be understood that, although the terms "first", "second", "third", etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section discussed below could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the inventive concept." Also, the term "exemplary" is intended to refer to an example or illustration.

It will be understood that when an element or layer is referred to as being "on", "connected to", "coupled to", or "adjacent" another element or layer, it can be directly on, connected to, coupled to, or adjacent the other element or layer, or one or more intervening elements or layers may be present. When an element or layer is referred to as being "directly on," "directly connected to", "directly coupled to", or "immediately adjacent" another element or layer, there are no intervening elements or layers present.

As used herein, the term "substantially," "about," and similar terms are used as terms of approximation and not as terms of degree, and are intended to account for the inherent variations in measured or calculated values that would be recognized by those of ordinary skill in the art.

As used herein, the terms "use," "using," and "used" may be considered synonymous with the terms "utilize," "utilizing," and "utilized," respectively.

Though the inventive concept has been described with reference to the embodiments illustrated in the drawings, this is merely exemplary and it will be understood by those of ordinary skill in the art that various suitable changes in form and details and equivalents thereof may be made therein without departing from the spirit and scope of the inventive concept as defined by the following claims and equivalents thereof.

What is claimed is:

1. A display device comprising:
   a substrate;
   a circuit element layer on the substrate, the circuit element layer comprising a thin film transistor, a storage capacitor, and a pixel electrode electrically connected to the thin film transistor and the storage capacitor;
   a display layer on the circuit element layer, the display layer comprising an emission layer, an opposite electrode on the emission layer, and a functional layer arranged in at least one of a space between the emission layer and the opposite electrode and a space between the emission layer and the pixel electrode;
   a thin encapsulation layer on the display layer, the thin encapsulation layer comprising at least one inorganic layer and at least one organic layer; and
   a through portion passing through the substrate, the circuit element layer, the display layer, and the thin encapsulation layer,
   wherein a slope angle of a lateral surface of the display layer adjacent to the through portion is different from a slope angle of one of a lateral surface of the substrate, a lateral surface of the circuit element layer, and a lateral surface of the thin encapsulation layer that are adjacent to the through portion.

2. The display device of claim 1, wherein the functional layer comprises at least one of a hole injection layer, a hole transport layer, an electron injection layer, and an electron transport layer.

3. The display device of claim 1, wherein the display layer comprises at least one of a capping layer and an inorganic barrier layer, at least one of the capping layer and the inorganic barrier layer being on the opposite electrode.

4. The display device of claim 1, further comprising:
   an additional inorganic layer on the thin encapsulation layer, the additional inorganic layer covering a lateral surface of the at least one organic layer that is adjacent to the through portion and the lateral surface of the display layer.

5. The display device of claim 4, wherein the additional inorganic layer directly contacts an inorganic insulating layer of the circuit element layer.

6. The display device of claim 1, further comprising:
   a step difference portion adjacent to the through portion and having an undercut shape.

7. The display device of claim 6, wherein the step difference portion is between the display layer and the substrate.

8. The display device of claim 6, wherein the step difference portion comprises:
   a first layer and a second layer comprising materials different from each other.

9. The display device of claim 1, wherein the substrate comprises a resin material.

* * * * *